(12) United States Patent
Hiramitsu

(10) Patent No.: US 9,780,684 B2
(45) Date of Patent: Oct. 3, 2017

(54) POWER CONVERTER

(71) Applicant: DENSO CORPORATION, Kariya, Aichi-pref. (JP)

(72) Inventor: Shinji Hiramitsu, Kariya (JP)

(73) Assignee: DENSO CORPORATION, Kariya (JP)

( * ) Notice: Subject to any disclaimer, the term of this patent is extended or adjusted under 35 U.S.C. 154(b) by 60 days.

(21) Appl. No.: 15/045,329

(22) Filed: Feb. 17, 2016

(65) Prior Publication Data

US 2016/0255714 A1    Sep. 1, 2016

(30) Foreign Application Priority Data

Feb. 26, 2015    (JP) .................... 2015-37252

(51) Int. Cl.
*H02M 7/00* (2006.01)
*H05K 1/02* (2006.01)
*H05K 3/28* (2006.01)

(52) U.S. Cl.
CPC .......... *H02M 7/003* (2013.01); *H05K 1/0209* (2013.01); *H05K 1/0215* (2013.01); *H05K 3/284* (2013.01); *H05K 2201/066* (2013.01); *H05K 2201/10053* (2013.01); *H05K 2201/10166* (2013.01)

(58) Field of Classification Search
CPC ....... H01L 2924/00; H01L 2924/00014; H01L 2224/48247; H01L 2924/00012; H01L 2224/73265; H01L 2224/48091; H01L 2924/13091; H01L 2924/181; H01L 2924/1305; H01L 2224/45015; H01L 2224/48227; H01L 2224/49111; H01L 2224/32225; H01L 2924/0002; H01L 2924/1306; G06F 19/3418; G06F 19/345;
(Continued)

(56) References Cited

U.S. PATENT DOCUMENTS

2005/0047044 A1*  3/2005  Nolden ................. H02M 5/257
                                                          361/103
2006/0044772 A1   3/2006  Miura
(Continued)

FOREIGN PATENT DOCUMENTS

JP    H05-41471 A    2/1993
JP    H8-023049 A    1/1996
(Continued)

*Primary Examiner* — Adam B Dravininkas
(74) *Attorney, Agent, or Firm* — Posz Law Group, PLC

(57) ABSTRACT

A power converter includes: a circuit board having an insulating substrate and a plurality of wirings in the insulating substrate; and first and second switching elements on a first surface of the circuit board that are connected in series. The first switching element has first and second electrodes. The second switching element has a third electrode and a fourth electrode. The circuit board has a first wiring connected to the first electrode, a second wiring connected to the second and third electrodes, a third wiring connected to the fourth electrode, a fourth wiring as an output wiring connected to the third electrode, and a fifth wiring connected to the third wiring. The first, second, third and fourth wirings are arranged in order on the first surface, and the fifth wiring on a second surface opposite to the first surface is opposed to the first, second, and third wirings.

13 Claims, 25 Drawing Sheets

(58) Field of Classification Search
CPC ...... G06F 3/044; G06F 3/0412; G06F 3/0416; H05K 7/02; H02M 7/003
See application file for complete search history.

(56) References Cited

U.S. PATENT DOCUMENTS

| | | | |
|---|---|---|---|
| 2007/0051974 A1* | 3/2007 | Azuma | H01L 24/40 257/177 |
| 2009/0001559 A1 | 1/2009 | Satou et al. | |
| 2009/0179321 A1 | 7/2009 | Sakamoto et al. | |
| 2010/0182097 A1* | 7/2010 | Hayashi | H04B 1/0458 333/32 |
| 2012/0075137 A1* | 3/2012 | Tanizawa | H03M 1/0621 341/157 |
| 2012/0099357 A1* | 4/2012 | Morita | H01L 27/0617 363/131 |
| 2013/0321249 A1* | 12/2013 | Kimura | G09G 3/3233 345/76 |
| 2013/0335920 A1* | 12/2013 | Murata | H05K 7/20236 361/699 |
| 2014/0160821 A1* | 6/2014 | Tokuyama | H01L 23/473 363/132 |
| 2014/0334203 A1* | 11/2014 | Honda | H01L 23/642 363/56.12 |
| 2015/0223339 A1* | 8/2015 | Nakamura | H01L 23/04 361/705 |
| 2015/0340338 A1* | 11/2015 | Lee | H01L 25/0655 257/531 |

FOREIGN PATENT DOCUMENTS

| | | |
|---|---|---|
| JP | H09-017827 A | 1/1997 |
| JP | 3229931 B2 | 11/2001 |
| JP | 2008-270527 A | 11/2008 |
| JP | 2013-171891 A | 9/2013 |

* cited by examiner ced on Japanese Patent Application
POWER CONVERTER

CROSS REFERENCE TO RELATED APPLICATION

This application is based on Japanese Patent Application No. 2015-37252 filed on Feb. 26, 2015, the disclosure of which is incorporated herein by reference.

TECHNICAL FIELD

The present disclosure relates to a power converter.

BACKGROUND

Conventionally, a three-level power converter, which is disclosed in Patent Document 1, is known as an example of a power converter. In this three-level power converter, a positive-side arm part and a negative-side arm part are disposed on both sides of a direct-current (DC) voltage source such that the DC voltage source is interposed between the positive-side arm part and the negative-side arm part. In the positive-side arm part, a second IGBT, a first connection diode, and a first IGBT are disposed in order from the DC voltage source side. In the negative-side arm part, a third IGBT, a second connection diode, and a fourth IGBT are disposed in order from the DC voltage source side.

It is conceivable that a power converter has a configuration in which switching elements are mounted on a circuit board provided with a plurality of wirings. Additionally, in a power converter, wirings between switching elements cross one another within a circuit board. Therefore, in a power converter, wirings crossing one another within a circuit board may increase the size of the power converter.

[Patent Document 1] JP 3229931 B1

SUMMARY

In view of the foregoing difficulty, it is an object of the present disclosure to provide a power converter that inhibits an increase in the size of the power converter.

According to an aspect of the present disclosure, the power converter includes: a circuit board that includes an insulating substrate and a plurality of wirings provided in the insulating substrate; and a first switching element and a second switching element that are arranged on a first surface of the circuit board and are connected in series. In addition, the first switching element has a first electrode and a second electrode, the second switching element has a third electrode and a fourth electrode. The plurality of wirings include a first wiring connected to the first electrode, a second wiring connected to the second electrode and the third electrode, a third wiring connected to the fourth electrode, a fourth wiring serving as an output wiring connected to the third electrode, and a fifth wiring connected to the third wiring. The first wiring, the second wiring, the third wiring, and the fourth wiring are arranged in a line in order and are arranged on the first surface, and the fifth wiring is provided on a second surface opposite to the first surface and is arranged to be opposed to the first wiring, the second wiring, and the third wiring.

As described above, in the present disclosure, the first wiring, the second wiring, the third wiring, and the fourth wiring are arranged in a line in that order. Therefore, the present disclosure can prevent the first wiring, the second wiring, the third wiring, and the fourth wiring from crossing one another within the circuit board, that is, within the insulating base material. Therefore, the present disclosure is able to inhibit wirings from, otherwise, crossing one another, resulting in an increase in the size of the power converter.

Additionally, in the present disclosure, the first, second, and third wirings are arranged to face the fifth wiring. Therefore, in the present disclosure, current flowing in the first, second, and third wirings can be made parallel to and reverse to current flowing in the fifth wiring. Accordingly, the present disclosure can reduce inductance, compared to a case where the first, second, and third wirings are not arranged to face the fifth wiring.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
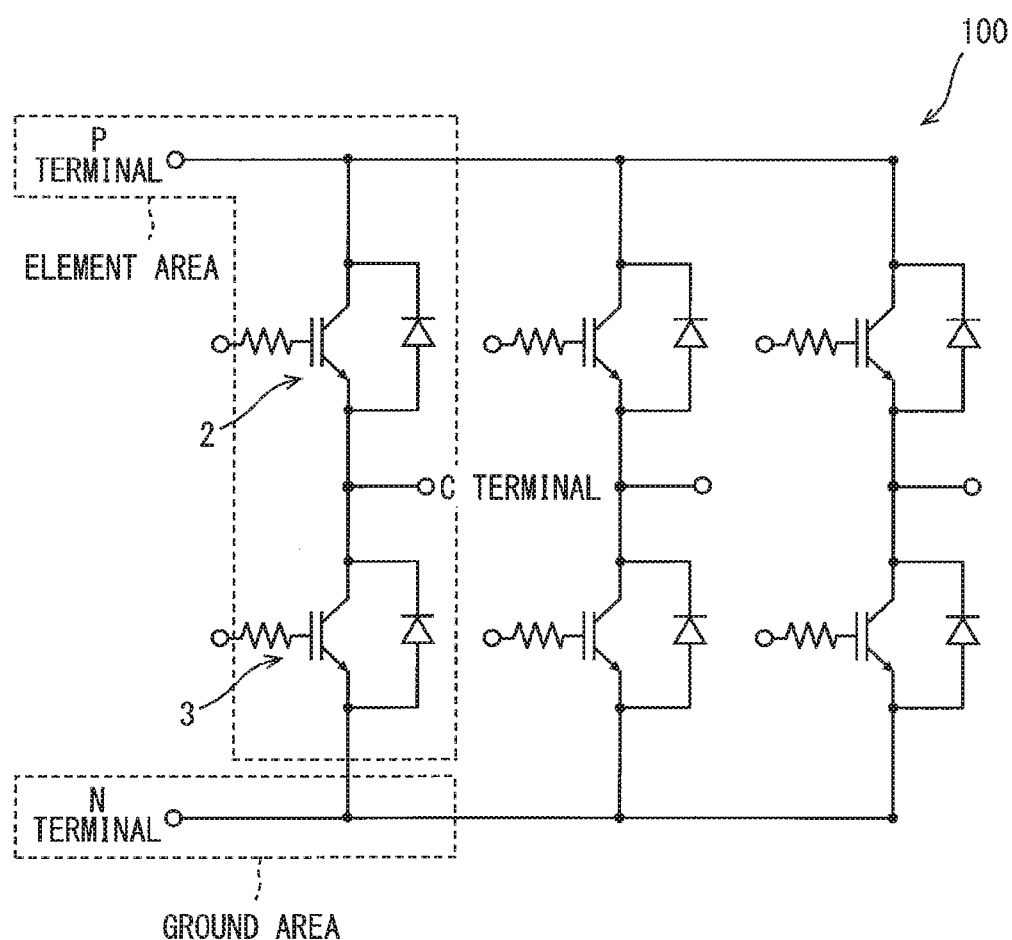
FIG. 1 is a circuit diagram illustrating a schematic configuration of a power converter according to an embodiment.

Referring to the drawings, embodiments for carrying out the invention will be described below. In each embodiment, a portion corresponding to a portion described in a preceding embodiment may be denoted with the identical reference sign and duplicate explanation thereof may be omitted. In each embodiment, when only part of a configuration is explained, other parts of the configuration may use, as reference, other embodiments explained before.

The present embodiment uses an example in which the present disclosure is applied to a power converter 100 shown in FIGS. 1 to 4. The power converter 100 can be applied to, for example, an inverter for controlling a motor. The power converter 100 can also be applied in an inverter that supplies power to, for example, a motor for traveling or motors for various controllers (auxiliary machines) in a hybrid vehicle or an electric vehicle.

First, referring to FIG. 1, a circuit structure for the power converter 100 will be described. The power converter 100 includes three series circuits each of which includes a first semiconductor element 2 and a second semiconductor element 3 connected in series. Although described in detail below, each of the first semiconductor element 2 and the second semiconductor element 3 is a switching element. Therefore, the power converter 100 includes the six switching elements. In other words, each series circuit includes two switching elements connected in series. Additionally, in other words, the power converter 100 is a three-phase output circuit having series circuits for three phases.

Additionally, the power converter 100 includes a P terminal which is a high-potential power source terminal, an N terminal which is a low-potential power source terminal, and a C terminal which is a control terminal. The C terminal is provided for each of the three series circuits, and is provided at a node between the first semiconductor element 2 and the second semiconductor element 3. In other words, the C terminals are output terminals.

Next, the structure of the power converter 100 will be described with reference to FIGS. 2 to 4. As shown in, for example, FIG. 2, the power converter 100 includes a circuit board 1 and semiconductor elements 2, 3. The power converter 100 further includes a first heat dissipation member 4, a second heat dissipation member 5, a joining member 12, a mold resin 13, and the like.

The semiconductor elements 2, 3 are arranged on a first surface of the circuit board 1. Each of the semiconductor elements 2, 3 is a power semiconductor element made of Si, Sic, GaN, or the like as its main constituent. Each of the semiconductor elements 2, 3 generates heat in operating by itself. Therefore, in other words, each of the semiconductor elements 2, 3 is a heating element. Each of the semiconductor elements 2, 3 is mounted on the circuit board 1 in the state of, for example, a bare chip. In the present embodiment, as each of the semiconductor elements 2, 3, an inversely conductive IGBT is employed, which incorporates an IGBT and a diode therein in parallel. However, the present disclosure is not limited thereto. Each of the semiconductor elements 2, 3 is a switching element, and a MOSFET, a GaN-HEMT, or the like can also be used. In other words, the first semiconductor element 2 may be called an upper-phase element, and the second semiconductor element 3 may be called a lower-phase element.

The first semiconductor element 2 is an element having a first emitter electrode 2b formed on a first surface facing the circuit board 1, and a first collector electrode 2a formed on a second surface which is the reverse of the first surface. The first semiconductor element 2 also has a gate electrode formed on the same surface as the first emitter electrode 2b. Although described in detail below, the first emitter electrode 2b is electrically and mechanically connected to a first output wiring 7 via the conductive joining member 12 and, thus, the first semiconductor element 2 is mounted on the circuit board 1. As the joining member 12, for example, solder, silver paste, sintered metal body, or the like can be employed.

The first semiconductor element 2 corresponds to a first switching element. The first emitter electrode 2b corresponds to a second electrode. The first collector electrode 2a corresponds to a first electrode.

The second semiconductor element 3 is a vertical element having a second emitter electrode 3b formed on a first surface facing the circuit board 1, and a second collector electrode 3a formed on a second surface which is the reverse of the first surface. The second semiconductor element 3 also has a gate electrode formed on the same surface as the second emitter electrode 3b. Although described in detail below, the second emitter electrode 3b is electrically and mechanically connected to a first ground wiring 8 via the conductive joining member 12 and, thus, the second semiconductor element 3 is mounted on the circuit board 1.

The second semiconductor element 3 corresponds to a second switching element. The second emitter electrode 3b corresponds to a fourth electrode. The second collector electrode 3a corresponds to a third electrode.

As described above, the semiconductor elements 2, 3 are mounted on the circuit board 1 such that the emitter electrodes 2b, 3b face the circuit board 1. In other words, both the semiconductor elements 2, 3 are mounted in the same direction with respect to the circuit board 1.

The circuit board 1 has a configuration in that a plurality of wirings and vias 9 made of conductive members are formed in an insulating base material such as a resin. As the circuit board 1, a so-called build-up board can be employed, which includes, for example, a core layer and a build-up layer stacked on the core layer. As the circuit board 1, a so-called any-layer board can also be employed, which includes a plurality of stacked build-up layers without a core layer. A four-layer-bonded board can also be employed, which is formed by bonding two double-sided boards. Furthermore, as the circuit board 1, a ceramic substrate using ceramic as an insulating base material can also be employed. The circuit board 1 has, for example, a rectangular parallelepiped shape. Specifically, the circuit board 1 has a first surface and a second surface opposite to the first surface, which are rectangular, and four sides which are continuous with the first surface and the second surface. Additionally, the present embodiment uses an example where both the semiconductor elements 2, 3 are mounted on the first surface of the circuit board 1; however, but a circuit element may be mounted on the second surface of the circuit board 1.

The vias 9 correspond to second interlayer connecting members. Each via 9 is formed from a conductive member and is provided from the first surface to the second surface. In other words, the via 9 is provided through the resin base material in the direction of the thickness thereof. The via 9 includes an interlayer connecting member such as a laser via or a blind via. The via 9 is embedded in the insulating base material of the circuit board 1, and connects the first and second ground wirings 8, 10 to be described below. Therefore, the first and second ground wirings 8, 10 are electrically connected by the via 9.

The circuit board 1 includes the plurality of wirings such as an input wiring 6, the first output wiring 7, the first ground wiring 8, the second ground wiring 10, and a second output wiring 11. Each of the wirings 6, 7, 8, 10, 11 is formed by patterning a foil-like conductive member. A large current flows in each of the wirings 6, 7, 8, 10, 11. The input wiring 6, the first output wiring 7, the first ground wiring 8, and the second output wiring 11 are formed on the first surface of the circuit board 1. The second ground wiring 10 is formed on the second surface of the circuit board 1.

The input wiring 9 corresponds to a first wiring. The input wiring 6 is electrically and mechanically connected to the first heat dissipation member 4 via the joining member 12. The input wiring 6 is electrically connected to the P terminal as well. The first heat dissipation member 4 corresponds to a first connecting member.

The first heat dissipation member 4 is made of, for example, a conductive material, such as copper or aluminum, as its main constituent. The first heat dissipation member 4 is a block body formed from the conductive member. The present embodiment employs, as an example, the first heat dissipation member 4 which is a block body sufficiently thicker than the thickness of each of the semiconductor elements 2, 3.

This first heat dissipation member 4 is electrically and mechanically connected, via the joining member 12, to the first collector electrode 2a as well. Thus, the first heat dissipation member 4 electrically connects the first collector electrode 2a and the input wiring 6. That is, the input wiring 6 is electrically connected to the first collector electrode 2a. The first heat dissipation member 4 dissipates heat generated by the first semiconductor element 2. Therefore, the first heat dissipation member 4 is a heat dissipation wiring member, that is, a member having a function as a wiring and a function as a heat dissipation member. Therefore, in other words, the first heat dissipation member 4 is a heat dissipation block having the function as the wiring.

Furthermore, the present embodiment employs a first heat dissipation member 4 that has a level difference in order to adjust the thickness of the joining member 12 on the input wiring 6 side and the thickness of the joining member 12 on the first collector electrode 2a side such that they are level with each other. In other words, the present embodiment employs a first heat dissipation member 4 that has a level difference in order to adjust the thickness of the joining member 12 on the input wiring 6 side and the thickness of the joining member 12 on the first emitter electrode 2b side such that they are level with each other. Specifically, in the first heat dissipation member 4, a portion facing the input wiring 6 projects further than a portion facing the first semiconductor element 2. That is, the first heat dissipation member 4 has a level difference formed at a surface facing the circuit board 1.

In the first heat dissipation member 4, the surface opposite to the surface facing the circuit board 1 is exposed from the mold resin 13 to be described below. This is because improved heat dissipation of the first heat dissipation member 4 is required. It is also conceivable that the first heat dissipation member 4 is brought into contact with a body to which the power converter 100 itself is attached, and thereby heat generated by the first semiconductor element 2 is dissipated to this body via the first heat dissipation member 4. Specifically, it is conceivable that heat is dissipated in such a manner that the power converter 100 is attached to a cooling device, which is the body, by its being directly brought into contact with and pressed against the cooling device, or by its being pressed against the cooling device via a heat dissipation material such as grease. Additionally, a device such as the power converter 100 is usually mounted on a flat surface of the body to which the power converter 100 is attached. Therefore, in the first heat dissipation member 4, it is preferable that the surface opposite to the surface facing the circuit board 1, that is, the surface in contact with the body to which the power converter 1 is attached be flat. The flat surface of the first heat dissipation member 4, in contact with the body to which the power converter 100 is attached, ensures the area of contact with this body and, therefore, the improvement of heat dissipation can be expected.

The first output wiring 7 corresponds to a second wiring. The first output wiring 7 is electrically and mechanically connected to the first emitter electrode 2b via the joining member 12, and is also electrically and mechanically connected to the second heat dissipation member 5 via another joining member 12. The second heat dissipation member 5 corresponds to a second connecting member.

The second heat dissipation member 5 is made of the same material as the first heat dissipation member 4 and is a block body, as with the first heat dissipation member 4. The present embodiment employs, as an example, the second heat dissipation member 5, which is a block body sufficiently thicker than each of the semiconductor elements 2, 3.

The second heat dissipation member 5 is electrically and mechanically connected to the second collector electrode 3a and the second output wiring 11 via the corresponding joining members 12. Thus, the second heat dissipation member 5 electrically connects the first output wiring 7 and the second collector electrode 3a, and also electrically connects the second collector electrode 3a and the second output wiring 11. That is, the first output wiring 7 is electrically connected to the second collector electrode 3a. The second output wiring 11 is also electrically connected to the second collector electrode 3a. Therefore, the second heat dissipation member 5 electrically connects the second collector electrode 3a, the first output wiring 7, and the second output wiring 11. Thus, the power converter 100 includes the second heat dissipation member 5 of trifurcated structure connected to the first output wiring 7, the second collector electrode 3a, and the second output wiring 11. In other words, in the power converter 100, a connector for a lower-phase arm has a trifurcated structure. In other words, in the power converter 100, the second collector electrode 3a side connection structure of each second semiconductor element 3 is trifurcated. The second output wiring 11 corresponds to a fourth wiring. The second output wiring 11 is electrically connected to the C terminal as well.

The second heat dissipation member 5 dissipates heat generated by the second semiconductor element 3. Therefore, the second heat dissipation member 5 is a heat dissipation wiring material, that is, a member having a function as a wiring and a function as a heat dissipation member. Therefore, in other words, the second heat dissipation member 5 is a heat dissipation block having the function as the wiring.

Additionally, the present embodiment employs the second heat dissipation member 5 that has a level difference in order to adjust the thickness of the joining member 12 on the first output wiring 7 side, the thickness of the joining member 12 on the second collector electrode 3a side, and the thickness of the joining member 12 on the second output wiring 11 side such that they are level with each other. In other words, the present embodiment employs the second heat dissipation member 5 that has a level difference in order to adjust the thickness of the joining member 12 on the first output wiring 7 side, the thickness of the joining member 12 on the second emitter electrode 3b side, and the thickness of the joining member 12 on the second output wiring 11 side such that they are level with each other. Specifically, in the second heat dissipation member 5, a portion facing the first output wiring 7 and a portion facing the second output wiring 11 project further than a portion facing the second semiconductor element 3. That is, the second heat dissipation member 5 has a level difference formed at a surface facing the circuit board 1.

As with the first heat dissipation member 4, in the second heat dissipation member 5, the surface opposite to the surface facing the circuit board 1 is exposed from the mold resin 13. It is also conceivable that the second heat dissipation member 5 is brought into contact with a body to which the power converter 100 is attached, and thereby heat generated by the second semiconductor element 3 is dissipated to this body via the second heat dissipation member 5. A device such as the power converter 100 is usually mounted on a flat surface of the body to which the power converter 100 is attached. Therefore, in the second heat dissipation member 5, it is preferable that the surface opposite to the surface facing the circuit board 1, that is, the surface in contact with the body, to which the power converter 1 is attached, be flat. The flat surface of the first heat dissipation member 5, in contact with the body to which the power converter 100 is attached, ensures the area of the contact with this body, and therefore the improvement in heat dissipation can be expected.

The first ground wiring 8 corresponds to a third wiring. This first ground wiring 8 is electrically and mechanically connected to the second emitter electrode 3b via the joining member 12. Therefore, the first ground wiring 8 is electrically and mechanically connected to the second ground wiring 10 by the via 9. The second ground wiring 10 corresponds to a fifth wiring. The second ground wiring 10 is electrically connected to the N terminal as well.

Figure 2:
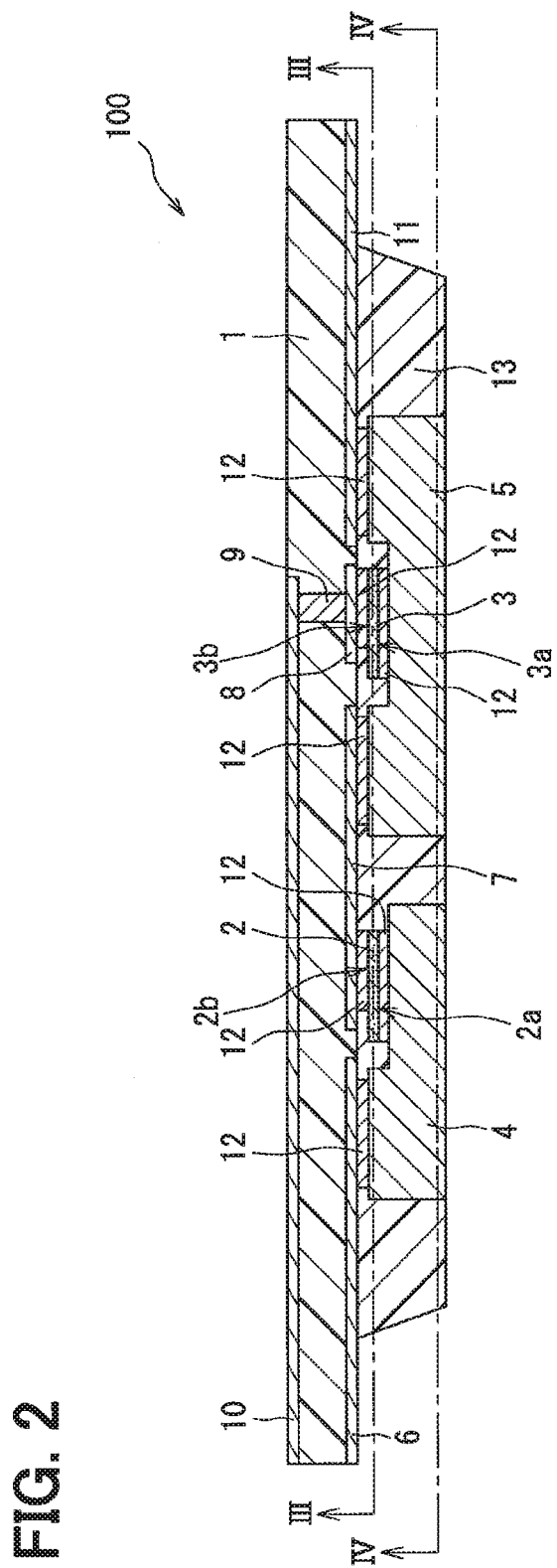
FIG. 2 is a sectional view illustrating the schematic configuration of the power converter according to the embodiment.
Figure 3:
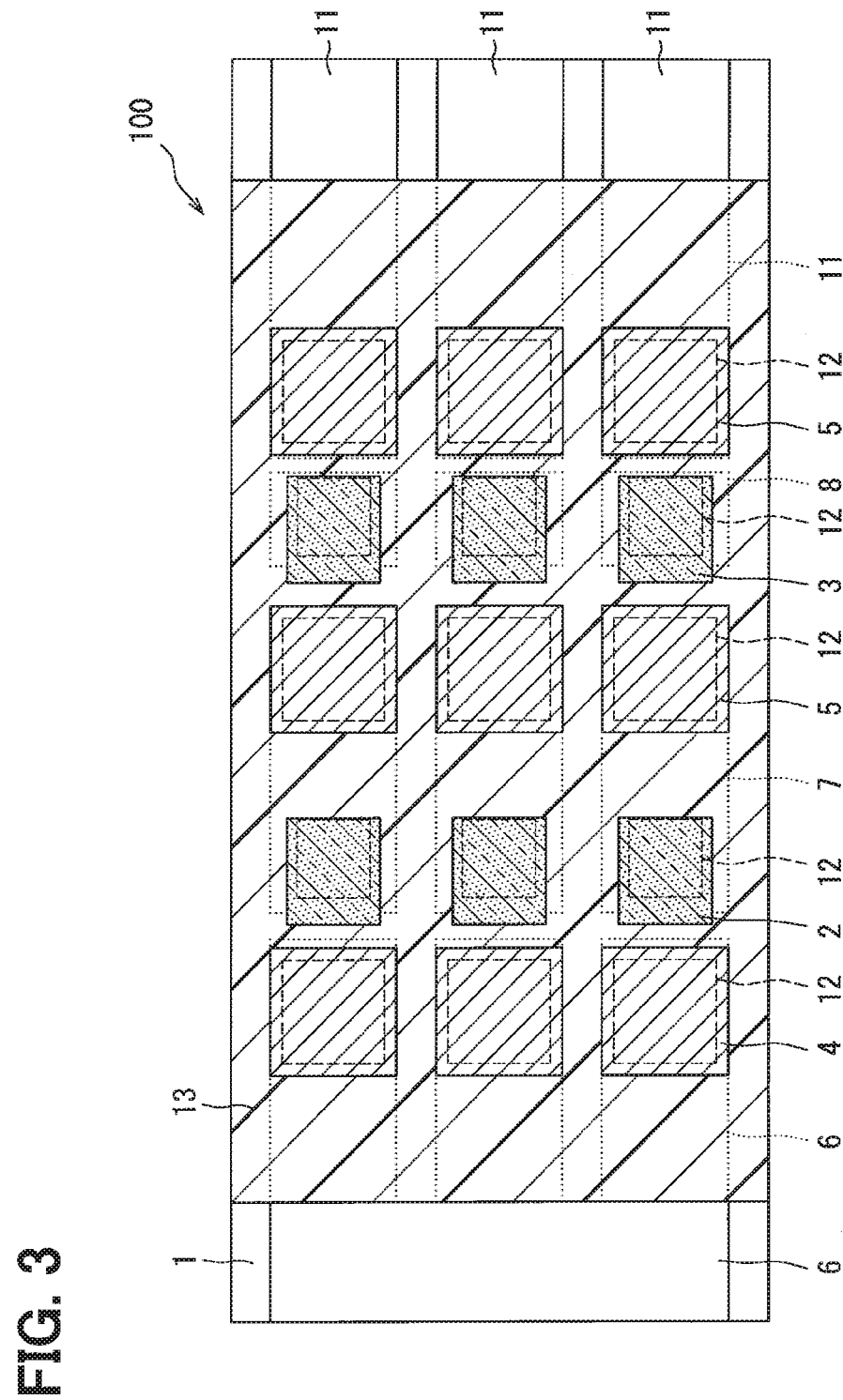
FIG. 3 is a sectional view taken along line III-III in FIG. 2.

Additionally, as shown in FIGS. 2, 3, the input wiring 6, the first output wiring 7, the first ground wiring 8, and the second output wiring 11 are arranged in a straight line in that order. A wiring group including the input wiring 6, the first output wiring 7, the first ground wiring 8, and the second output wiring 11 corresponds to a straight wiring unit. As shown in FIG. 4, as with the straight wiring unit, both the first and second semiconductor elements 2, 3 are arranged in a straight line, and both the heat dissipation members 4, 5 are arranged in a straight line. Additionally, in the present embodiment, the respective areas of the second heat dissipation member 5 to which the first output wiring 7, the first ground wiring 8, and the second output wiring 11 are connected, are provided in a straight line, as with the straight wiring unit.

However, in the present disclosure, as shown in FIG. 3, all the rectangular input wiring 6, first output wiring 7, first ground wiring 8, and second output wiring 11 do not all have to be arranged in a straight line. Additionally, each of the input wiring 6, the first output wiring 7, the first ground wiring 8, and the second output wiring 11 does not have to be rectangular. In the present disclosure, it is enough for at least respective parts of the input wiring 6, first output wiring 7, first ground wiring 8, and second output wiring 11 to be arranged on the common imaginary straight line on the first surface of the circuit board 1. That is, respective parts of the input wiring 6, first output wiring 7, first ground wiring 8, and second output wiring 11 may be curved. Similarly, in the present disclosure, it is enough for at least part of the first heat dissipation member 4 and at least part of the second heat dissipation member 5 to be arranged on the imaginary straight line described above. In the present disclosure, it is enough for at least part of the first semiconductor element 2 and at least part of the second semiconductor element 3 to be arranged on the imaginary straight line described above. A rectangular shape herein refers to a shape when each of the wirings 6, 7, 8, 11 is seen from the first surface of the circuit board 1.

As shown in FIG. 3, the straight wiring units are provided in correspondence with the three series circuits in the power converter 100. The straight wiring units are provided in parallel with one another. In FIG. 3, three straight wiring units are arranged in parallel with one another in the widthwise direction of the power converter 100. That is, the input wiring 6, first output wiring 7, first ground wiring 8, and second output wiring 11 in each straight wiring unit are arranged in the lengthwise direction of the power converter 100. However, the input wiring 6 may be shared among the three series circuits as shown in FIG. 3. The first and second heat dissipation members 4, 5 are provided for each of the three straight wiring units. That is, the power converter 100 has three first heat dissipation members 4 and three second heat dissipation members 5.

Figure 4:
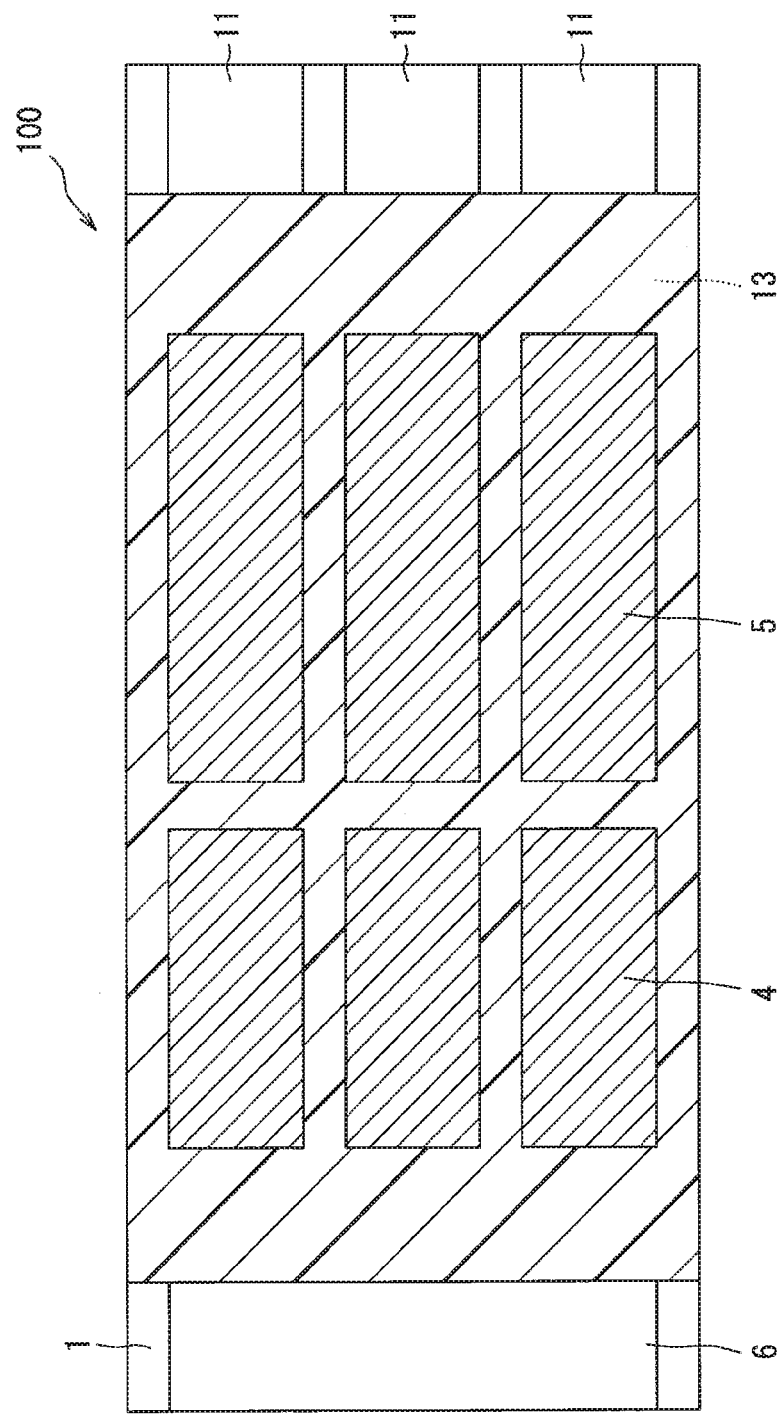
FIG. 4 is a sectional view taken along line IV-IV in FIG. 2.

As shown in FIGS. 2, 4, the second ground wiring 10 is arranged to face the input wiring 6, the first output wiring 7, and the first ground wiring 8. Specifically, the circuit board 1 is arranged to have a positional relation in which the input wiring 6, the first output wiring 7, and the first ground wiring 8 face the second ground wiring 10 with the insulating base material of the circuit board 1 therebetween. In other words, the second ground wiring 10 is arranged parallel to each of the input wiring 6, the first output wiring 7, and the first ground wiring 8. That is to say, in the power converter 100, an element area and a ground area, both of which are shown in broken lines in FIG. 1, are arranged in parallel. The second ground wiring 10 may be called N wiring because the N terminal is connected thereto. Meanwhile, a wiring group including the input wiring 6, the first output wiring 7, and the first ground wiring 8 may be called a P wiring. Additionally, the second output wiring 11 may be called a C wiring. Furthermore, in other words, the element area and the ground area may be called a first area and a second area, respectively.

However, in the present disclosure, the respective entire areas of the input wiring 6, first output wiring 7, and first ground wiring 8 do not have to face the second ground wiring 10. It is enough for at least respective parts of the input wiring 6, first output wiring 7, and first ground wiring 8 to face the second ground wiring 10.

The mold resin 13 is composed of, for example, epoxy resin and so on as its main constituents. The mold resin 13 corresponds to a resin part. The mold resin 13 is provided on only the first surface side of the circuit board 1. Therefore, the second ground wiring 10 provided on the surface opposite to the circuit board 1 is not sealed by the mold resin 13.

The mold resin 13 seals both the semiconductor elements 2, 3, and also seals at least respective parts of the input wiring 6, first output wiring 7, first ground wiring 8, and second output wiring 11. For example, while exposing part of the input wiring 6 and part of the second output wiring 11, the mold resin 13 seals both the semiconductor elements 2, 3, the remaining input wiring 6, the first output wiring 7, the first ground wiring 8, and the remaining output wiring 11. That is to say, while exposing part of the input wiring 6 and part of the second output wiring 11, the mold resin 13 covers both the semiconductor elements 2, 3, the remaining input wiring 6, the first output wiring 7, the first ground wiring 8, and the remaining output wiring 11 in a close contact manner. The mold resin 13 is also in close contact with part of the first surface of the circuit board 1.

Additionally, the mold resin 13 seals the first heat dissipation member 4 and the second heat dissipation member 5 while exposing, as described above, the surfaces of these heat dissipation members 4, 5, which surfaces are opposite to the corresponding surfaces facing the circuit board 1. That is to say, the mold resin 13 covers the first heat dissipation member 4 and the second heat dissipation member 5 in close contact with the first and second heat dissipation members 4, 5, while exposing the surfaces of the first and second heat dissipation members 4, 5, which surfaces are opposite to the corresponding surfaces facing the circuit board 1. In the power converter 100, since the respective parts of the first and second heat dissipation members 4, 5 are exposed from the mold resin 13, heat dissipation can be improved compared to the case where the whole of the first heat dissipation member 4 and the whole of the second heat dissipation member 5 are sealed with the mold resin 13.

Generally, in a semiconductor element, the area of a collector electrode formed on a different surface as a gate electrode is greater than that of an emitter electrode formed on the same surface as the gate electrode. Specifically, in the semiconductor elements 2, 3, the respective areas of the surfaces of the collector electrodes 2a, 3a opposite to the heat dissipation members 4, 5 are greater than the respective areas of the surfaces of the emitter electrodes 2b, 3b opposite to the circuit board 1. Accordingly, in the power converter 100, since the collector electrodes 2a, 3a are connected to the heat dissipation members 4, 5, respectively, substantial heat dissipation is easily ensured. That is, in the power converter 100, heat dissipation can be improved compared to the case where the emitter electrodes 2b, 3b are connected to the heat dissipation members 4, 5, respectively.

Additionally, in the power converter 100, only the first surface side of the circuit board 1 is sealed with the mold resin 13. Therefore, the power converter 100 may be called a half-mold package. The mold resin 13 can be formed by compression molding or transfer molding. However, the power converter 100 does not have to include the mold resin 13.

To manufacture the power converter 100, in a first step, a circuit board 1 in which each wiring such as an input wiring 6 is formed in an insulating base material is prepared. Next, in a second step, a first semiconductor element 2 and a second semiconductor element 3 are simultaneously mounted on the circuit board 1, thereby manufacturing a first structure. Next, in a third step, a first heat dissipation member 4 and a second heat dissipation member 5 are mounted simultaneously on the first structure, thereby manufacturing a second structure. The second and third steps can be carried out simultaneously. Then, in the third step, a mold resin 13 is formed on the second structure, thereby manufacturing the power converter 100. As described above, in the power converter 100, mounting the semiconductor elements 2, 3, and heat dissipation members 4, 5 simultaneously on the circuit board 1 and sealing them with the mold resin 13 eliminate the step of connecting the semiconductor elements 2, 3 after separately sealing these elements 2, 3, thus making it possible to simplify the steps. Additionally, since the semiconductor elements 2, 3 are sealed with the mold resin 13 collectively, the power converter 100 can be reduced in size more than in a case where a package in which a first semiconductor element 2 is sealed and a package in which a second semiconductor element 3 is sealed are used. The foregoing manufacturing method is merely an example.

Figure 7:
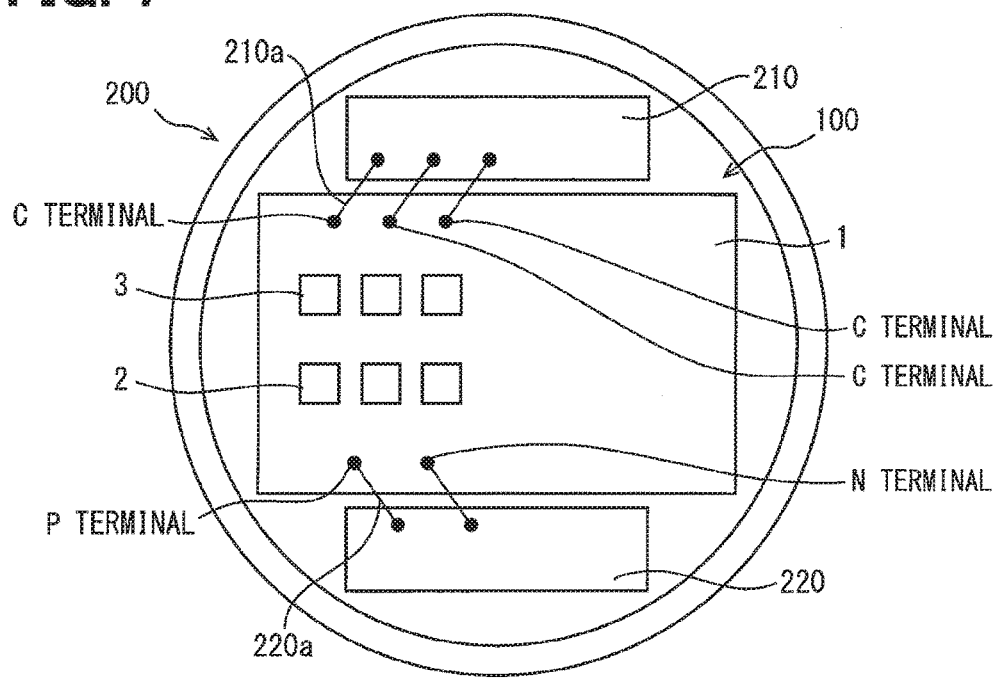
FIG. 7 is a plan view illustrating a mounting structure for the power converter according to the embodiment.

The power converter 100 thus configured can be directly mounted on an electronic apparatus, which is an output target (i.e., a control target). The electronic apparatus is a body to which the power converter 100 is attached. As such a body, for example, a motor or the like can be employed, as described above. FIG. 7 shows, as an example, a schematic configuration of the power converter 100 mounted on a motor housing 200. The respective C terminals of the phases in the power converter 100 are electrically connected to the corresponding terminals of a motor-side connector 210 via motor-side connection wires 210a. The P terminal and N terminal of the power converter 100 are electrically connected to the corresponding terminals of a power source-side connector 220 via power source-side connection wires 220a. The respective C terminals of the phases refer to a U-phase terminal, a V-phase terminal, and a W-phase terminal.

As described above, in the power converter 100, the input wiring 6, the first output wiring 7, the first ground wiring 8, and the second output wiring 11 are arranged in that order in a straight line. Therefore, the power converter 100 can prevent the input wiring 6, the first output wiring 7, the first ground wiring 8, and the second output wiring 11 from crossing one another within the circuit board 1, that is, within the insulating base material. Therefore, the power converter 100 is able to inhibit wirings from, otherwise, crossing one another, resulting in an increase in the size of the power converter 100. Especially, in a power converter, when wirings in which large electric current flow cross one another within an insulating base material, the distance between wirings has to be increased in order to retain insulation between the wirings. As a result, an increase in the size of the power converter becomes significant. In contrast to this, in the power converter 100, even when large electric current flows in the input wiring 6, first output wiring 7, first ground wiring 8, and second output wiring 11, these wirings are prevented from crossing one another in the insulating base material and, accordingly, an increase in the size of the power converter 100 can be inhibited.

Figure 5:
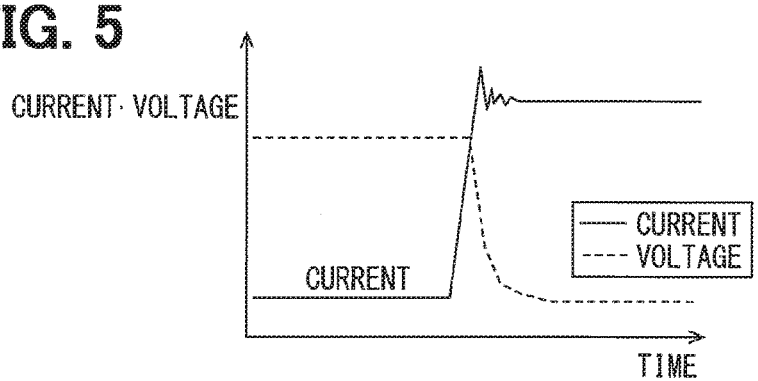
FIG. 5 is a graph illustrating output characteristics of the power converter according to the embodiment.
Figure 6:
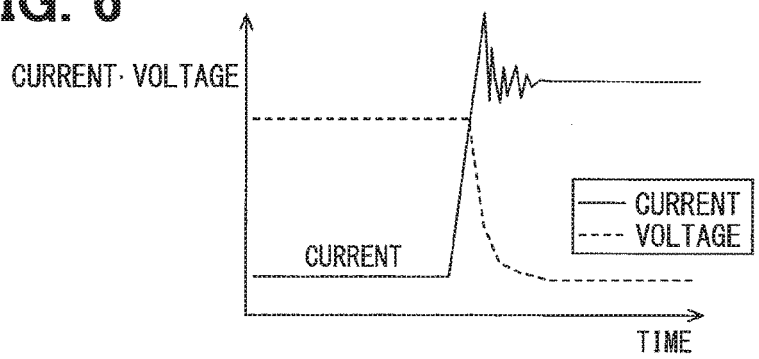
FIG. 6 is a graph illustrating output characteristics of a power converter according to a comparative example.

Additionally, in the power converter 100, the input wiring 6, the first output wiring 7, and the first ground wiring 8 are arranged to face the second ground wiring 10. Therefore, in the power converter 100, current flowing in the input wiring 6, first output wiring 7, and first ground wiring 8 can be made parallel to and reverse to current flowing in the second ground wiring 10. That is to say, in the power converter 100, since the P wiring and the N wiring are arranged in parallel, the direction of current flowing in the P wiring and the direction of current flowing in the N wiring can be made reverse to each other. By virtue of this, the power converter 100 can realize a low inductance. That is, the power converter 100 can reduce inductance, compared to a case where a P wiring and an N wiring are not arranged in parallel. This is apparent from the output characteristics of the power converter 100 shown in FIG. 5 and the output characteristics of a comparative example shown in FIG. 6. The comparative example is an example of a power converter in which a P wiring and an N wiring are not arranged in parallel.

Furthermore, the power converter 100 has, as shown in FIG. 7, the one P terminal, the one N terminal, and the three C terminals. Therefore, when the power converter 100 is mounted in the motor housing 200 and is electrically connected to the motor, three motor-side connection wires 210a and two power source-side connection wires 220a are connected to the power converter 100. In this case, in the power converter 100, as shown in FIG. 7, it is preferable that the P terminal and the N terminal be arranged along the same side of the circuit board 1 and the three C terminals be arranged along another side of the circuit board 1, which is different from the side for the P wiring and so on. That is, by doing so, the power converter 100 is able to prevent the three motor-side connection wires 210a and the two power source-side connection wires 220a from tangling.

A preferred embodiment of the present disclosure has been described above. However, the present disclosure is not limited by the foregoing embodiment and various modifications can be made in the invention without departing from the spirit and scope of the invention. Next, Modification Examples 1 to 16 of the present disclosure will be described below. The embodiment described above and Modification Examples 1 to 16 can be implemented alone but can also be implemented by suitably combining them. The present disclosure is not limited to combinations presented in the embodiments, but can be implemented by various combinations thereof.

Modification Example 1

Figure 8:
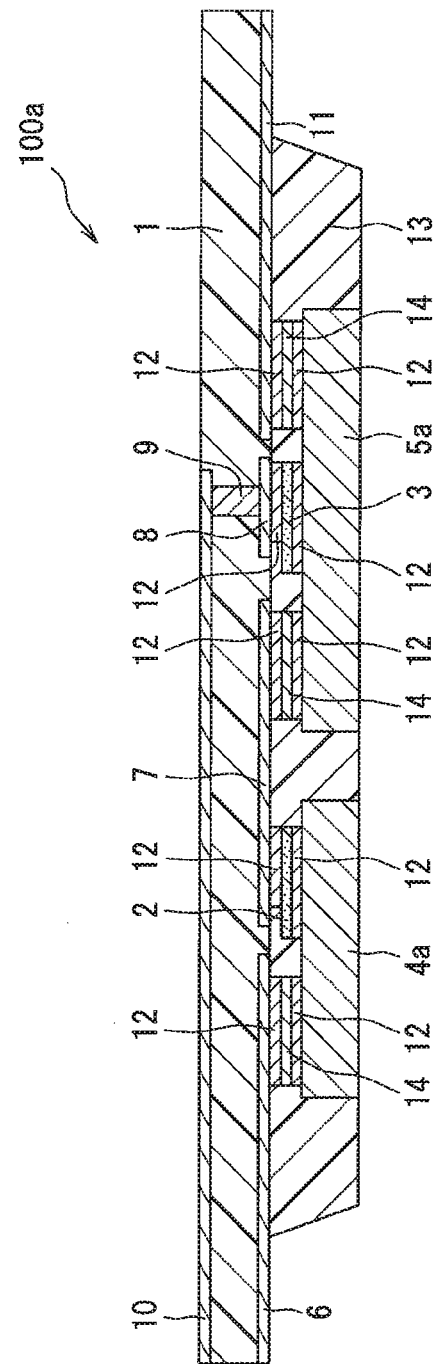
FIG. 8 is a sectional view illustrating a schematic configuration of a power converter according to Modification Example 1.

As shown in FIG. 8, a power converter 100a in Modification Example 1 differs from the power converter 100 in that the power converter 100a includes metal terminals 14 and the structures of a first heat dissipation member 4a and second heat dissipation member 5a are different from those in the power converter 100.

The first heat dissipation member 4a and the second heat dissipation member 5a are made of, for example, a conductive material such as copper or aluminum, as their main constituent. Each of the first and second heat dissipation members 4a, 5a is a plate-like member formed from a conductive member. The present embodiment employs, as an example, the first and second heat dissipation members 4a, 5a which are plate-like members sufficiently thicker than semiconductor elements 2, 3.

Additionally, the power converter 100a includes the metal terminals 14 which are equal in thickness to the semiconductor elements 2, 3. The first heat dissipation member 4a is electrically and mechanically connected to the corresponding metal terminal 14 via a joining member 12, the metal terminal 14 being electrically and mechanically connected to an input wiring 6 via another joining member 12. Similarly, the second heat dissipation member 5a is electrically and mechanically connected to the corresponding metal terminal 14 via a joining member 12, the metal terminal 14 being electrically and mechanically connected to a first output wiring 7 via another joining member 12. Additionally, the second heat dissipation member 5a is electrically and mechanically connected to the corresponding metal terminal 14 via a joining member 12, the metal terminal 14 being electrically and mechanically connected to a second output wiring 11 via another joining member 12.

The power converter 100a is able to exhibit the same advantageous effects as the power converter 100. Furthermore, in the power converter 100a, the first heat dissipation member 4a and the input wiring 6 are connected via the metal terminal 14, and the second heat dissipation member 5a and the first and second output wirings 7, 11 are connected via the corresponding metal terminals 14. By virtue of this, in the power converter 100a, the shapes of the first and second heat dissipation members 4a, 5a can be simplified. That is to say, the first and second heat dissipation members 4a, 5a do not have to have level differences unlike the first and second heat dissipation members 4, 5.

Modification Example 2

Figure 9:
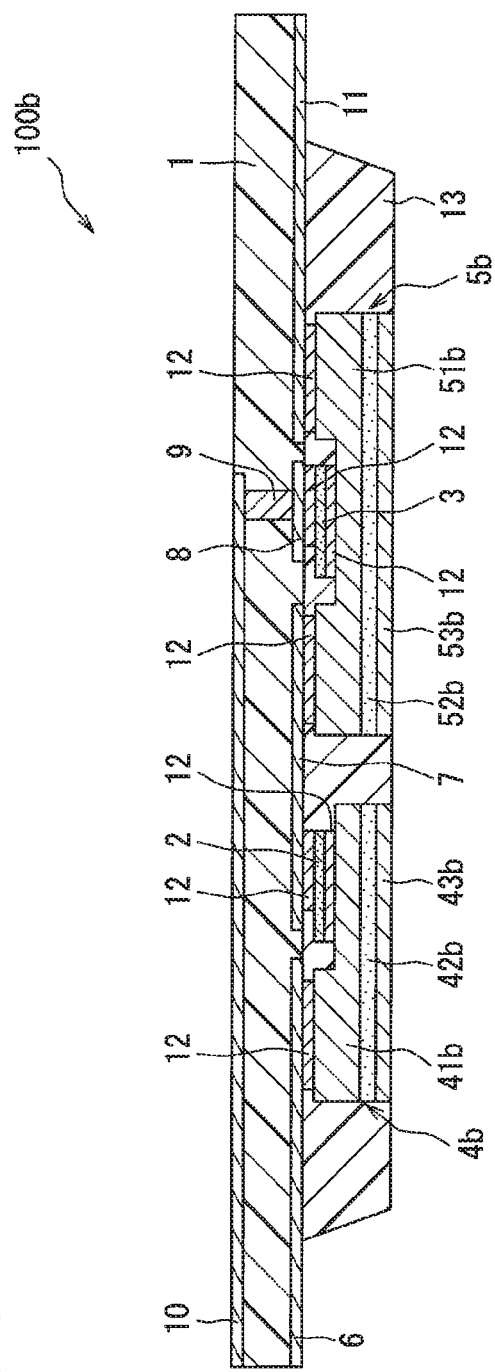
FIG. 9 is a sectional view illustrating a schematic configuration of a power converter according to Modification Example 2.

As shown in FIG. 9, a power converter 100b in Modification Example 2 differs from the power converter 100 in the respective structures of the first heat dissipation member 4b and second heat dissipation member 5b.

The first heat dissipation member 4b has a laminated structure in which a first member 41b, an insulating layer 42b, and a second member 43b are arranged in that order from the circuit board 1 side. The first member 41b and the second member 43b are made of, for example, a conductive material such as copper or aluminum. In particular, it is preferable that, in the first heat dissipation member 4b, the first member 41b located near a first semiconductor element 2 be thicker than the second member 43b since heat dissipation can be improved.

The second heat dissipation member 5b has a laminated structure in which a first member 51b, an insulating layer 52b, and a second member 53b are arranged in that order from the circuit board 1 side. The first member 51b and the second member 53b are made of a conductive material such as copper or aluminum. In particular, it is preferable that, in the second heat dissipation member 5b, the first member 51b located near a second semiconductor element 3 be thicker than the second member 53b since heat dissipation can be improved.

As described above, the power converter 100b employs insulating metal members as the first and second heat dissipation members 4b, 5b.

The power converter 100b is able to exhibit the same advantageous effects as the power converter 100. Additionally, the power converter 100b uses the first and second heat dissipation members 4b, 5b that are insulating metal members, thus eliminating the need for insulating members or the like on the outside of the power converter 100b. Specifically, in the power converter 100b, there is no need to provide insulating sheets or the like on parts of the first and second heat dissipation members 4b, 5b, which parts are exposed from a mold resin 13.

Additionally, since the first heat dissipation member 4b has the structure in which the insulation layer 42b is interposed between the first and second members 41b, 43b that are conductive members, the first heat dissipation member 4b is able to ensure insulation as well as heat dissipation. This is the same for the second heat dissipation member 5b.

Modification Example 3

Figure 10:
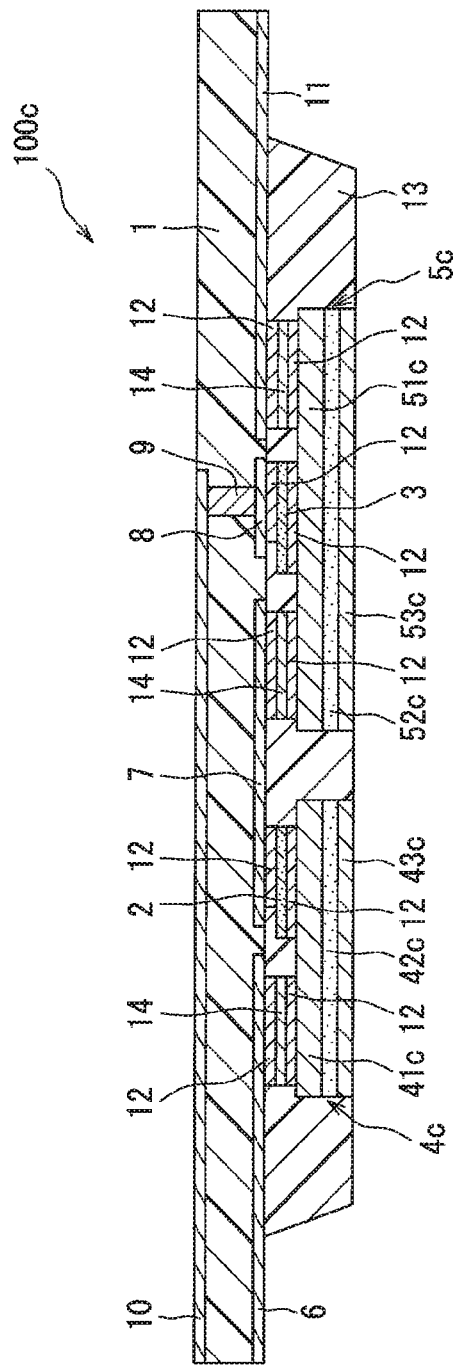
FIG. 10 is a sectional view illustrating a schematic configuration of a power converter according to Modification Example 3.

As shown in FIG. 10, a power converter 100c in Modification Example 3 differs from the power converter 100a in the respective structures of the first heat dissipation member 4c and second heat dissipation member 5c.

The first heat dissipation member 4c has a laminated structure in which a first member 41c, an insulating layer 42c, and a second member 43c are arranged in that order from the circuit board 1 side. The first member 41c and the second member 43c are made of a conductive material such as copper or aluminum. In particular, it is preferable that, in the first heat dissipation member 4b, the first member 41c located near a first semiconductor element 2 be thicker than the second member 43c since heat dissipation can be improved.

The second heat dissipation member 5c has a laminated structure in which a first member 51c, an insulating layer 52c, and a second member 53c are arranged in that order from the circuit board 1 side. The first member 51c and the second member 53c are made of a conductive material such as copper or aluminum. In particular, it is preferable that, in the second heat dissipation member 5c, the first member 51c located near a second semiconductor element 3 be thicker than the second member 53c since heat dissipation can be improved.

The power converter 100c is able to exhibit the same advantageous effects as the power converters 100, 100a, 100b.

Modification Example 4

Figure 11:
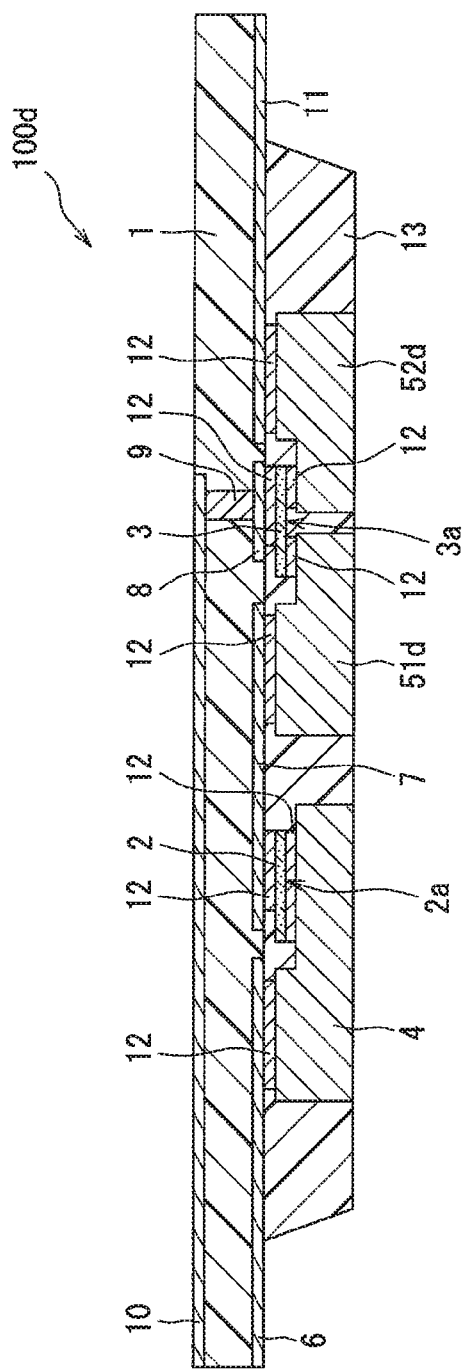
FIG. 11 is a sectional view illustrating a schematic configuration of a power converter according to Modification Example 4.

As shown in FIG. 11, a power converter 100d in Modification Example 4 differs from the power converter 100 in the structure of the second heat dissipation member.

The power converter 100d has, as the second heat dissipation member, a first member 51d and a second member 52d provided separately. The first member 51d and the second member 52d are made of a conductive material such as copper or aluminum. The first member 51d and the second member 52d are identical in shape to each other and to the first heat dissipation member 4.

The first member 51d is electrically and mechanically connected to a first output wiring 7 via a joining member 12, and is also electrically and mechanically connected to a second collector electrode 3a via another joining member 12. That is to say, the first member 51d connects the first output wiring 7 and the first ground wiring 8.

The second member 52d is electrically and mechanically connected to a second collector electrode 3a via a joining member 12, and is also electrically and mechanically connected to a second output wiring 11 via another joining member 12. That is to say, the second member 52d connects the second output wiring 11 and the first ground wiring 8.

The power converter 100d is able to exhibit the same advantageous effects as the power converter 100. Additionally, in the power converter 100d, the first and second members 51d, 52d can be rendered identical in shape to the first heat dissipation member 4. Accordingly, the second heat dissipation member can use the same components as the first heat dissipation member 4.

Modification Example 5

Figure 12:
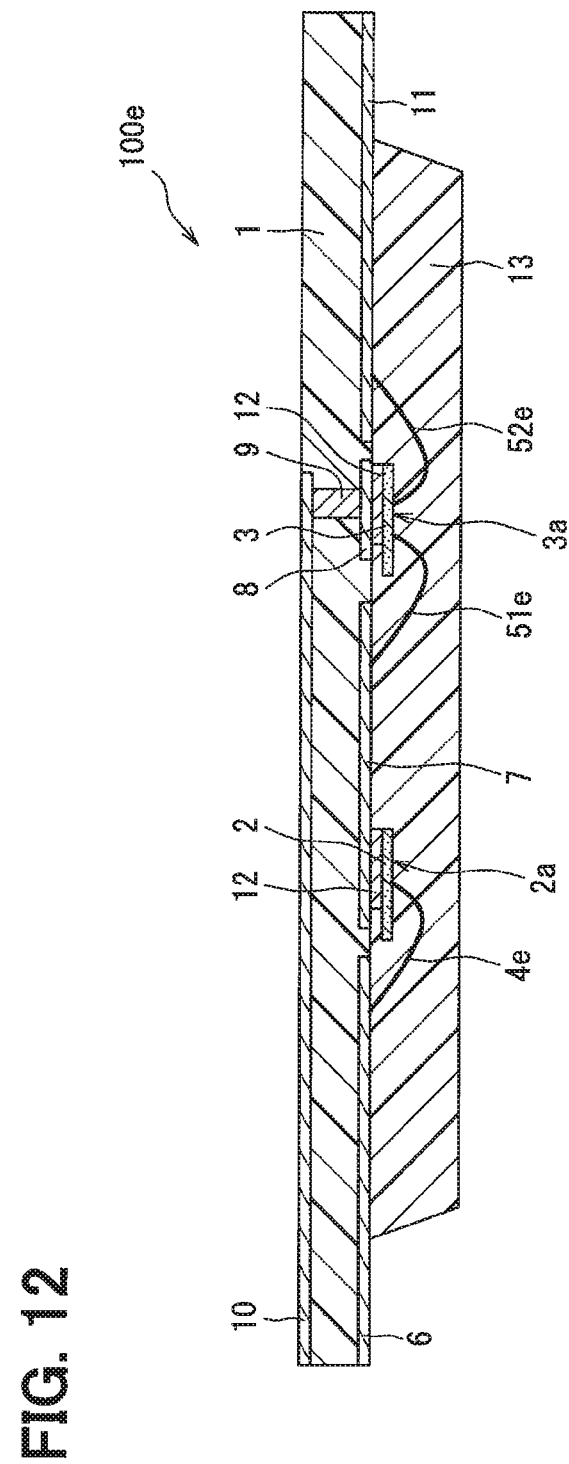
FIG. 12 is a sectional view illustrating a schematic configuration of a power converter according to Modification Example 5.

As shown in FIG. 12, a power converter 100e in Modification Example 5 differs from the power converter 100 in that wires 4e, 51e, 52e are used instead of the heat dissipation members.

The first wire 4e electrically connects an input wiring 6 and a first collector electrode 2a. The second wire 51e electrically connects a second collector electrode 3a and a first output wiring 7. The third wire 52e electrically connects the second collector electrode 3a and a second output wiring 11.

The first wire 4e corresponds to a first connecting member or a first bonding wire. The second wire 51e and the third wire 52e correspond to second connecting members. The second wire 51e corresponds to a second bonding wire. The third wire 52e corresponds to a third bonding wire.

The power converter 100e is able to exhibit the same advantageous effects as the power converter 100. Additionally, the power converter 100e does not have to use heat dissipation members 4, 5 which are block bodies or plate members. Accordingly, the power converter 100e is easily assembled than the power converter 100 and so on.

Modification Example 6

Figure 13:
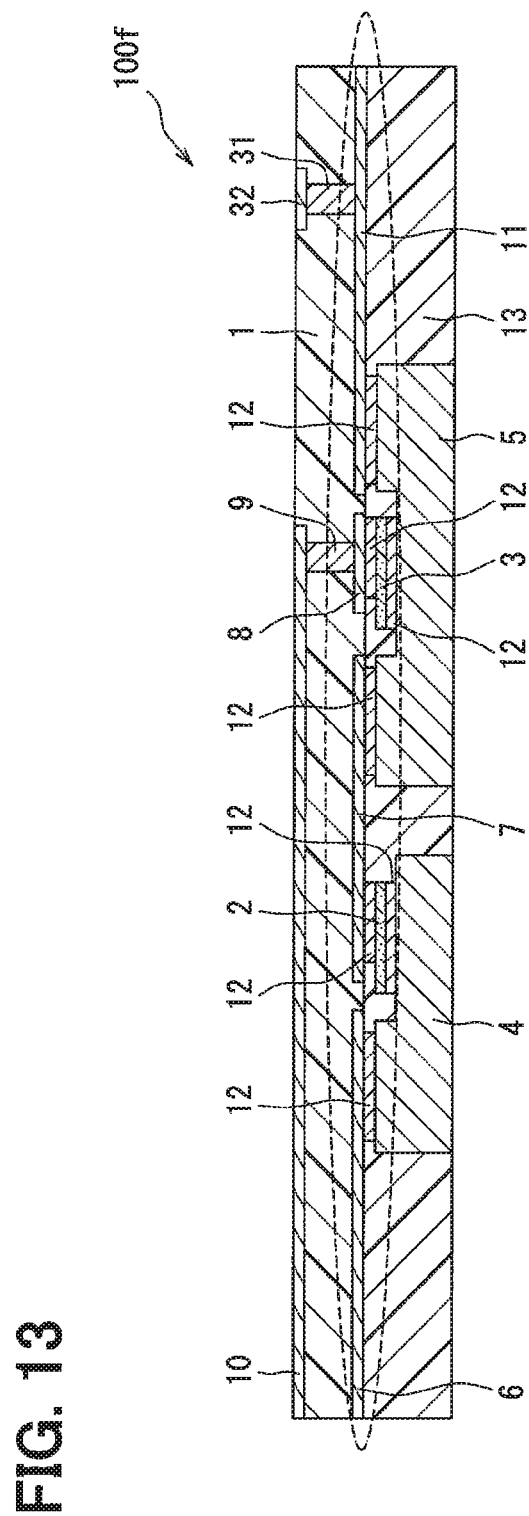
FIG. 13 is a sectional view illustrating a schematic configuration of a power converter according to Modification Example 6.

As shown in FIG. 13, the power converter 100f in Modification Example 6 differs from the power converter 100 in that a first surface of a circuit board 1 is entirely sealed and in the configuration of the circuit board 1. However, for convenience sake, identical parts in the power converter 100f are denoted with the same reference signs as those in the power converter 100.

In the power converter 100f, the entire area of the first surface of the circuit board 1 is sealed with a mold resin 13. In the circuit board 1, a via 31 and a terminal 32 is provided in an insulating base material. The via 31 is embedded in the insulating base material and is electrically and mechanically connected to a second output wiring 11. The terminal 32 is formed on the opposite surface of the circuit board 1 and is electrically and mechanically connected to the via 31. That is, in the power converter 100f, a pull-out position for the second output wiring 11 is located on the opposite surface side. The terminal 32 can be called a land or a pad.

The power converter 100f is able to exhibit the same advantageous effects as the power converter 100. Additionally, the power converter 100f is preferable because a P wiring and a C wiring are entirely sealed with mold resin 13. Furthermore, the power converter 100f has the via 31 and the terminal 32 and, therefore, even in a case where the C wiring is sealed with the mold resin 13, the C wiring can be pulled out.

Modification Example 7

Figure 14:
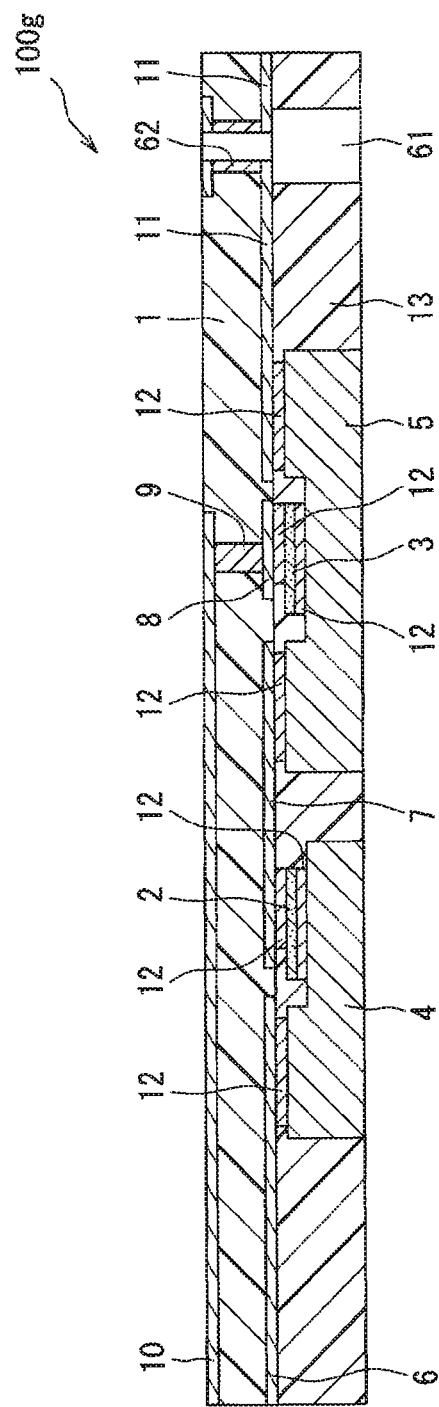
FIG. 14 is a sectional view illustrating a schematic configuration of a power converter according to Modification Example 7.

As shown in FIG. 14, a power converter 100g in Modification Example 7 differs from the power converter 100f in the structure of a circuit board 1 and the structure of a mold resin 13. However, for convenience sake, identical parts in the power converter 100g are denoted with the same reference signs as those in the power converter 100f.

The circuit board 1 includes a board through-hole 62 provided with a conductive member electrically and mechanically connected to a second output wiring 11. Specifically, the board through-hole 62 is a part where the conductive member extending from the second output wiring 11 is formed in the surface of a through-hole formed in an insulating base material. Therefore, the board through-hole 62 passes through the insulating base material of the circuit board 1 in the thickness direction. The board through-hole 62 can be called a through-hole.

Additionally, the mold resin 13 includes a mold through-hole 61 communicating with the board through-hole 62. The mold through-hole 61 passes through the mold resin 13 in the thickness direction.

The mold through-hole 61 and the board through-hole 62 are holes into which a terminal of an output target, such as a motor, is inserted. A terminal of an output target is inserted into the mold through-hole 61 and the board through-hole 62, is brought into contact with the conductive member of the board through-hole 62, and is thereby electrically connected to the second output wiring 11.

The power converter 10g is able to exhibit the same advantageous effects as the power converter 100f.

Modification Example 8

Figure 15:
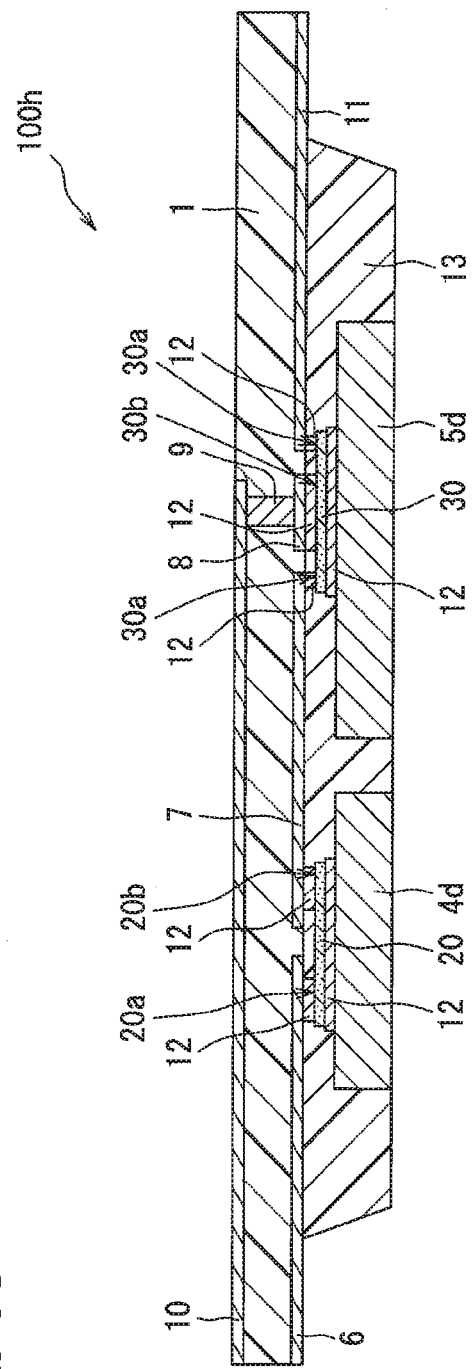
FIG. 15 is a sectional view illustrating a schematic configuration of a power converter according to Modification Example 8.

As shown in FIG. 15, a power converter 100h in Modification Example 8 differs from the power converter 100 in that the power converter 100h uses horizontal semiconductor elements.

A first semiconductor element 20 is a horizontal element in which a first emitter electrode 20a and a first collector electrode 20b are formed on a surface facing a circuit board 1. In the first semiconductor element 20, a third heat dissipation member 4d is mechanically connected, via a joining member 12, to a surface opposite to the surface facing the circuit board 1. The third heat dissipation member 4d is a plate-like member made of a conductive material such as copper or aluminum. Unlike the first heat dissipation member 4 and so on, the third heat dissipation member 4d has a function as a heat dissipation material but does not have a function as a wiring. In the third heat dissipation member 4d, a surface opposite to a surface facing the first semiconductor element 20 is exposed from a mold resin 13.

The first emitter electrode 20a corresponds to a first electrode. The first collector electrode 20b corresponds to a second electrode.

The second semiconductor element 30 is a horizontal element in which a second emitter electrode 30a and a second collector electrode 30b are formed on a surface facing the circuit board 1. In the second semiconductor element 30, a fourth heat dissipation member 5d is mechanically connected, via a joining member 12, to a surface opposite to the surface facing the circuit board 1. Since the fourth heat dissipation member 5d is identical to the third heat dissipation member 4d, the explanation thereof is omitted.

The second emitter electrode 30a corresponds to a third electrode. The second collector electrode 30b corresponds to a fourth electrode.

The power converter 100h is able to exhibit the same advantageous effects as the power converter 100. Additionally, in the power converter 100h, the third and fourth heat dissipation members 4d, 5d do not have to connect to a circuit board 1.

Modification Example 9

Figure 16:
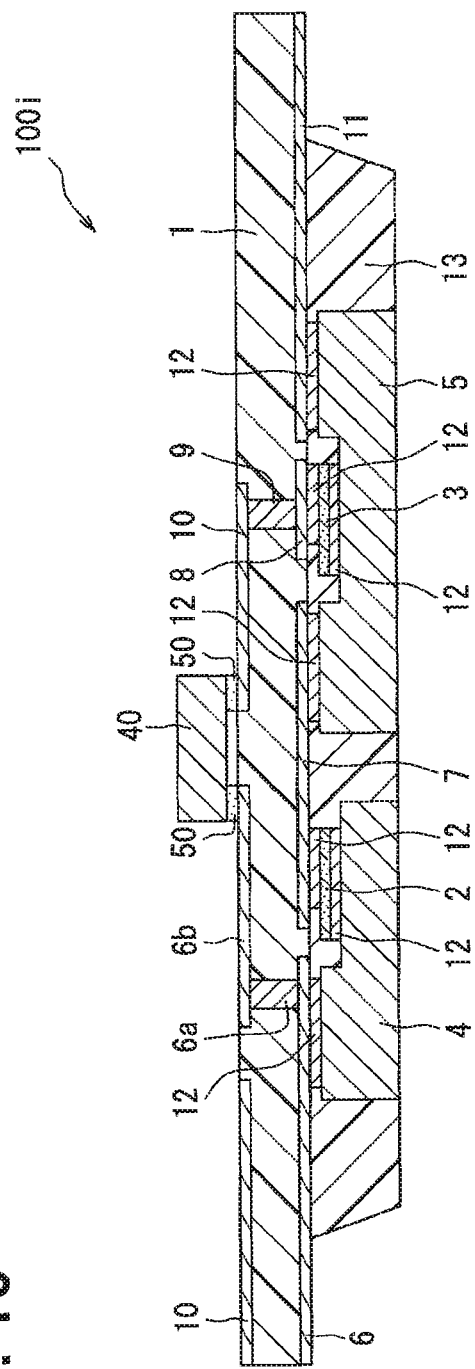
FIG. 16 is a sectional view illustrating a schematic configuration of a power converter according to Modification Example 9.
Figure 17:
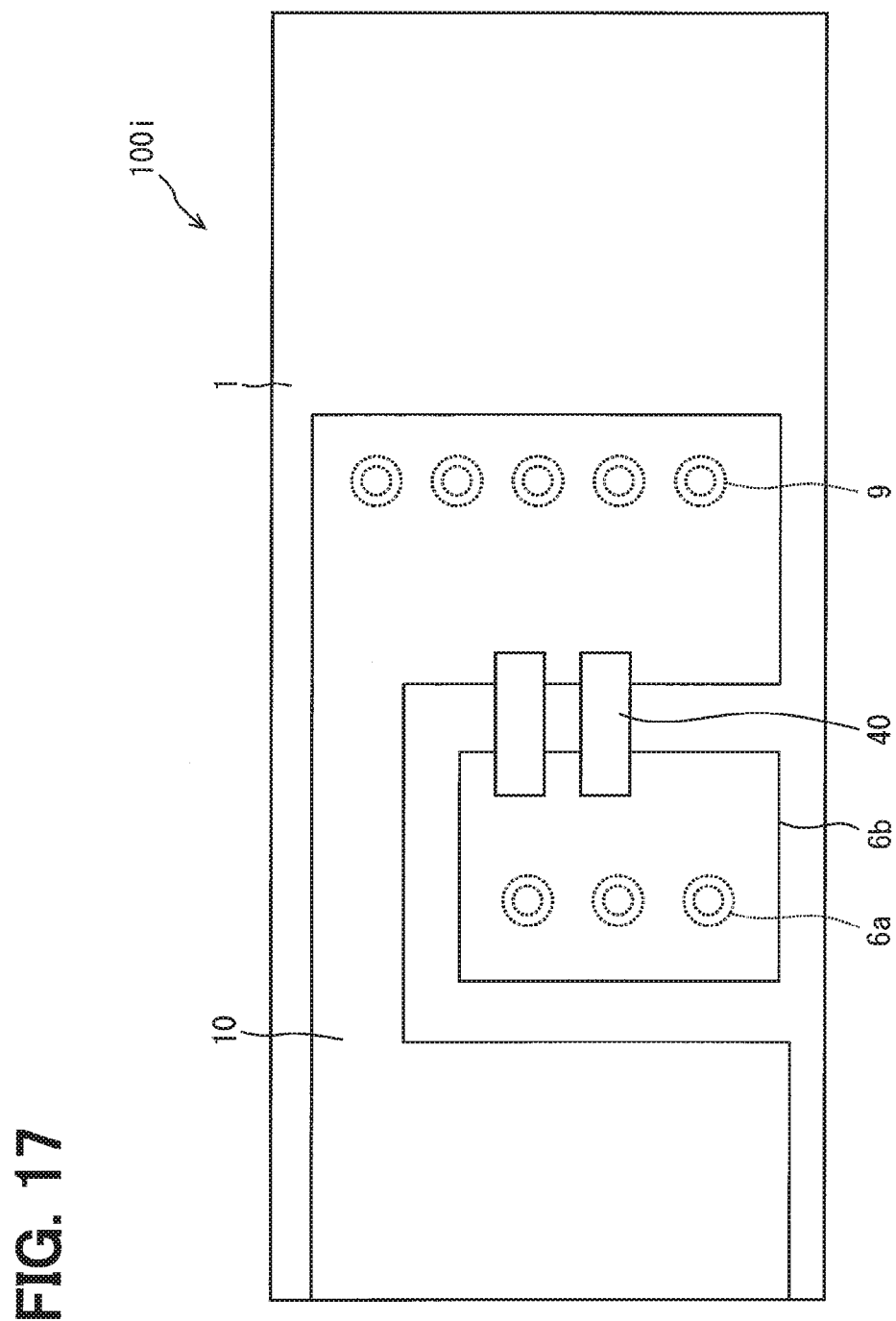
FIG. 17 is a plan view illustrating a schematic configuration of the power converter according to Modification Example 9.

A power converter 100i in Modification Example 9 differs from the power converter 100 in that a snubber capacitor 40, serving as a snubber circuit, is mounted on an opposite surface of a circuit board 1, as shown in FIGS. 16, 17. The circuit board 1 and a second ground wiring 10 differ from those in the embodiment described above. However, for convenience sake, the circuit board 1 and the second ground wiring 10 are denoted with the same reference signs as those above.

The circuit board 1 has a via 6a embedded in an insulating base material and electrically and mechanically connected to an input wiring 6. The via 6a is formed of a conductive member. Additionally, in the circuit board 1, a separation part 6b electrically connected to the input wiring 6 via the via 6a is formed on the opposite surface. That is to say, the circuit board 1 includes part of the input wiring 6 on the opposite surface thereof. Because of this, in the circuit board 1, the second ground wiring 10 is provided so as to avoid the separation part 6b. The via 6a corresponds to a first interlayer connecting member.

Additionally, in the circuit board 1, the snubber capacitor 40 is mounted on the opposite surface. That is, the snubber capacitor 40 is mounted on the same surface as the second ground wiring 10 in the circuit board 1. To be specific, the snubber capacitor 40 is electrically connected to the second ground wiring 10 and the separation part 6b via corresponding joining members 50. The joining members 50 are the same as the joining members 12.

Figure 18:
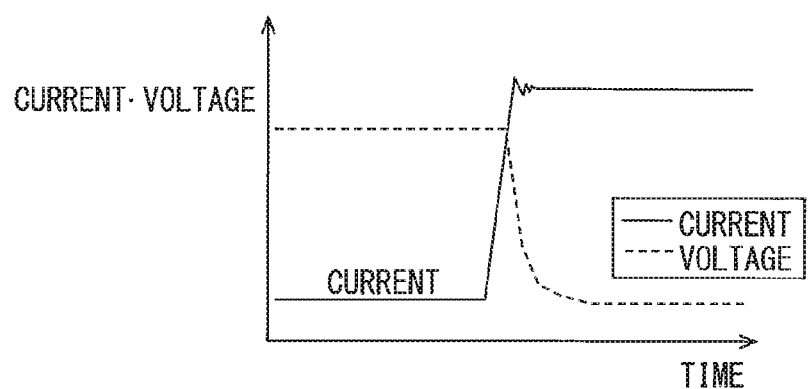
FIG. 18 is a graph illustrating output characteristics of the power converter according to Modification Example 9.

The power converter 100i is able to exhibit the same advantageous effects as the power converter 100. Additionally, as shown in FIG. 18, the power converter 100i is able to absorb surge voltages and exhibit satisfactory output characteristics, compared to where a snubber capacitor 40 is not mounted. These effects are apparent from FIGS. 18, 6.

Modification Example 10

Figure 19:
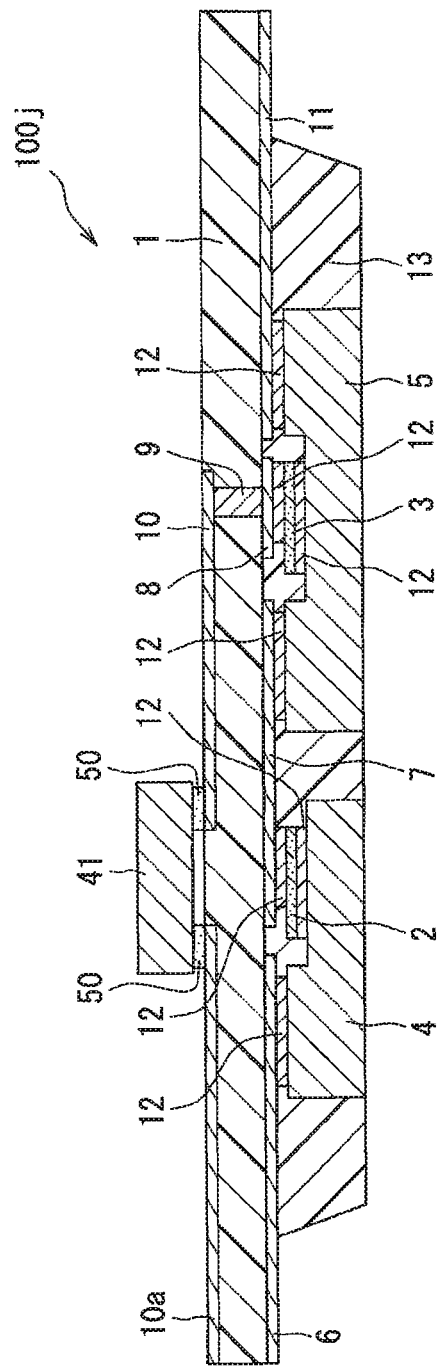
FIG. 19 is a sectional view illustrating a schematic configuration of a power converter according to Modification Example 10.
Figure 20:
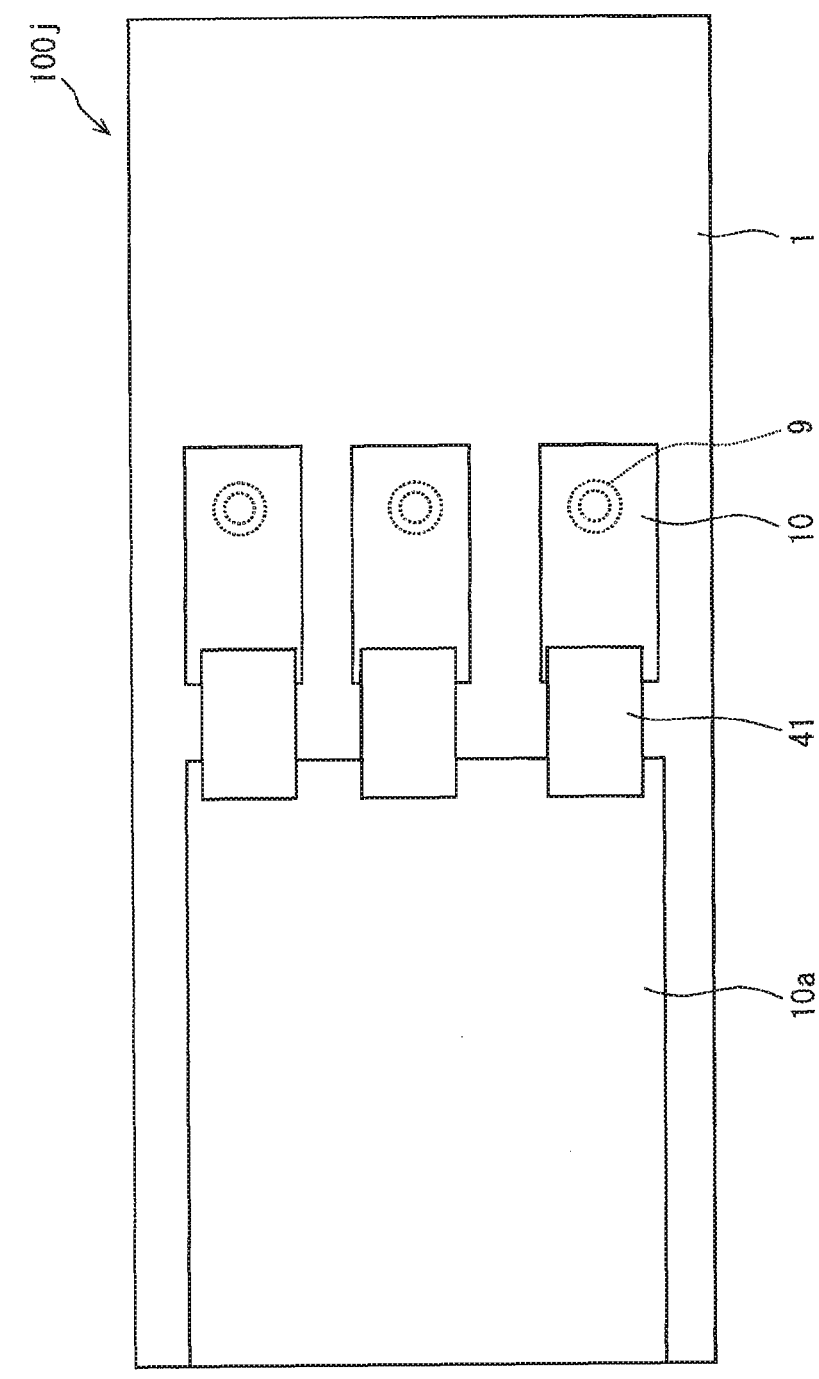
FIG. 20 is a plan view illustrating a schematic configuration of the power converter according to Modification Example 10.

As shown in FIGS. 19, 20, a power converter 100j in Modification Example 10 differs from the power converter 100 in that a shunt resistor 41 for detecting current is mounted. A circuit board 1 and a second ground wiring 10 differ from those in the embodiment described above. However, for convenience sake, the circuit board 1 and the second ground wiring 10 are denoted with the same reference signs as those above. The shunt resistor 41 corresponds to a detecting element. In the present disclosure, a detecting element for detecting voltage may be mounted instead of the shunt resistor 41.

In addition to the second ground wiring 10, the circuit board 1 has on its opposite surface a division part 10a, i.e., part of a wiring, arranged in a position different from the second ground wiring 10. The second ground wiring 10 and the division part 10a correspond to a fifth wiring.

The shunt resistor 41 is mounted on the opposite surface of the circuit board 1. This shunt resistor 41 is mounted on the second ground wiring 10 and the division part 10a via corresponding joining members 50. That is, the second ground wiring 10 and the division part 10a are electrically connected via the shunt resistor 41. In other words, in the power converter 100j, the second ground wiring is formed of a plurality of wiring members 10, 10a electrically connected via the shunt resistor 41.

The power converter 100j is able to exhibit the same advantageous effects as the power converter 100.

Modification Example 11

Figure 21:
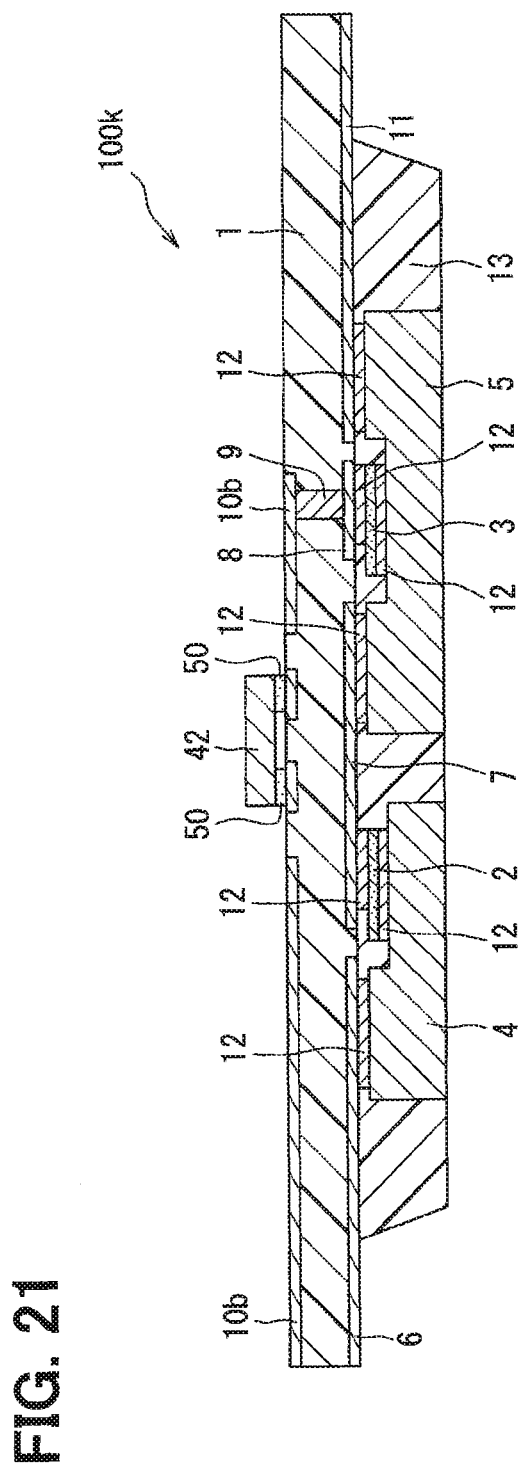
FIG. 21 is a sectional view illustrating a schematic configuration of a power converter according to Modification Example 11.
Figure 22:
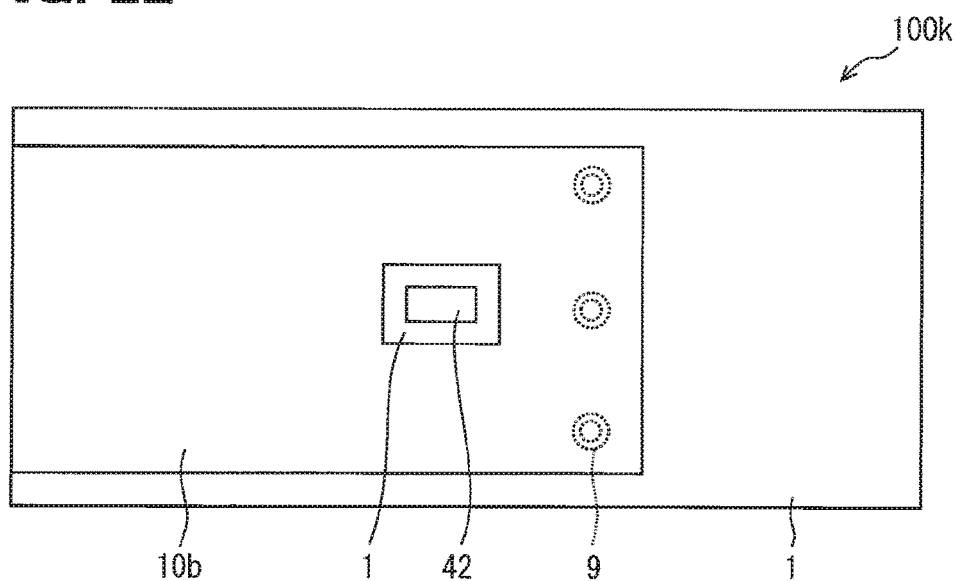
FIG. 22 is a plan view illustrating the schematic configuration of the power converter according to Modification Example 11.

As shown in FIGS. 21, 22, a power converter 100k in Modification Example 11 differs from the power converter 100 in that a thermistor 42 is mounted. A circuit board 1 differs in configuration from that in the embodiment described above. However, for convenience sake, the circuit board 1 is denoted with the same reference sign as that described above.

In the circuit board 1, the thermistor 42 is mounted on an opposite surface via joining members 50. That is, the thermistor 42 is electrically and mechanically connected to the circuit board 1 via the joining members 50. This thermistor 42 is a sensor for detecting a temperature of the circuit board 1, and corresponds to a temperature sensor. In the circuit board 1, the thermistor 42 is mounted on the opposite surface and, therefore, a second ground wiring 10b is provided so as to avoid the thermistor 42. That is, in the second ground wiring 10b, an opening part is formed so as to avoid the thermistor 42. The second ground wiring 10b corresponds to a fifth wiring.

In the power converter 100k, among the three phases, namely, the U phase, V phase, and W phase, the temperature of the semiconductor element in the phase arranged in the middle tends to become highest. Therefore, it is preferable that the thermistor 42 be arranged on the wiring in the phase arranged in the middle.

The power converter 100k is able to exhibit the same advantageous effects as the power converter 100. Additionally, since the power converter 100k has the thermistor 42, the power converter 100k is able to output its own temperature.

Modification Example 12

Figure 23:
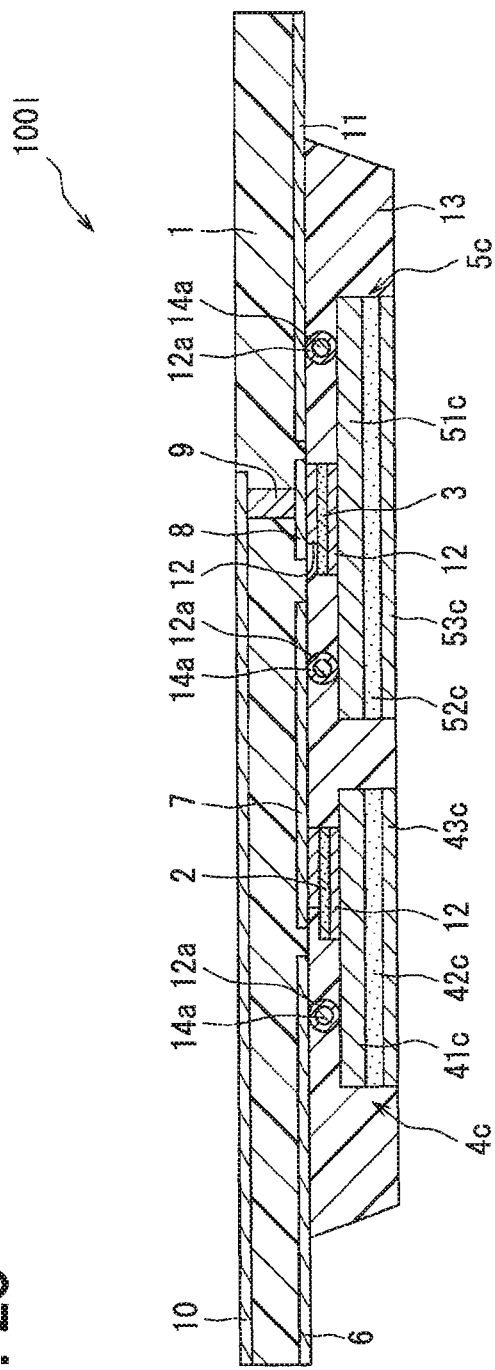
FIG. 23 is a sectional view illustrating a schematic configuration of a power converter according to Modification Example 12.

As shown in FIG. 23, a power converter 100l in Modification Example 12 differs from the power converter 100c in the structure of joining members 12a. In the above, the letter "l" is the small letter of "L" of the English alphabet.

Each joining member 12a is solder containing a metal ball core 14a. In other words, each joining member 12a is a ball member whose metal ball core 14a is covered with solder. Since the joining members 12a are known in technique, detailed explanations thereof are omitted.

In the power converter 100l, an input wiring 6 and a first heat dissipation member 4c are connected to each other by means of the joining member 12a. Additionally, in the power converter 100l, a second heat dissipation member 5c is connected to a first output wiring 7 and a second output wiring 11 via the corresponding joining members 12a.

It is enough for the input wiring 6 and the first heat dissipation member 4c to be connected with each other by means of at least one joining member 12a. Similarly, it is enough for the second heat dissipation member 5c and the first output wiring 7 to be connected with each other by means of at least one joining member 12a. Similarly, it is enough for the second heat dissipation member 5c and the second output wiring 11 to be connected with each other by means of at least one joining member 12a.

The power converter 100l is able to exhibit the same advantageous effects as the power converter 100c. Additionally, since each joining member 12a contains the metal ball core 14a, the thickness of each joining member 12a can be made uniform more easily than the thickness of each joining member 12. Accordingly, in the power converter 100l, the heights of the first and second heat dissipation members 4c, 5c are easily made uniform when these members are fitted to the circuit board 1. The height of the first heat dissipation member 4c and the height of the second heat dissipation member 5c refer to the distance between the first heat dissipation member 4c and the first surface of the circuit board 1 and the distance between the second heat dissipation member 5c and the first surface of the circuit board 1.

Modification Example 13

Figure 24:
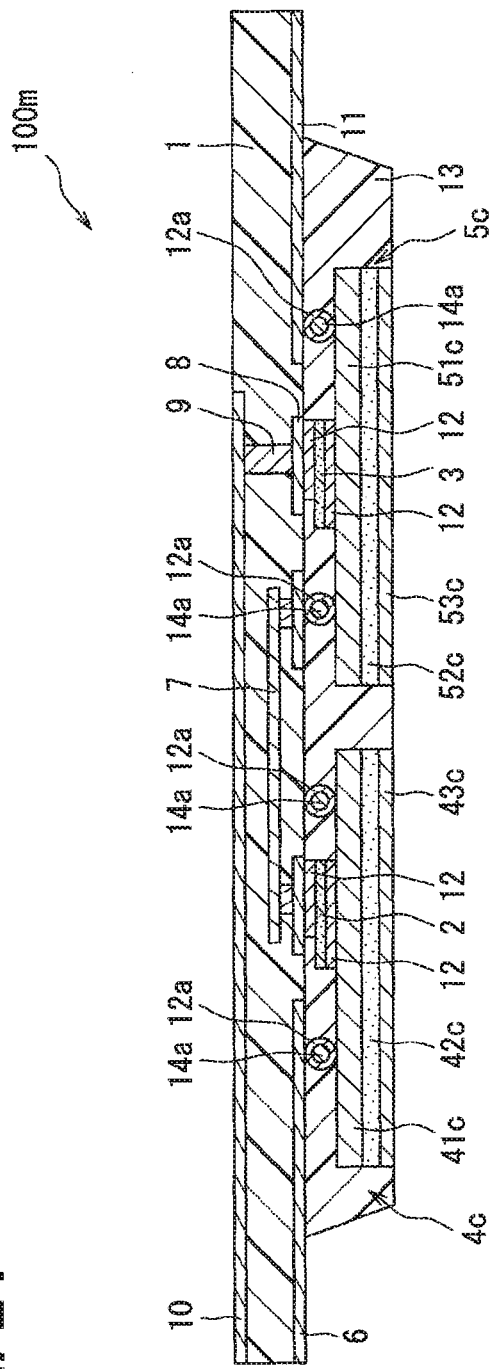
FIG. 24 is a sectional view illustrating a schematic configuration of a power converter according to Modification Example 13.

As shown in FIG. 24, a power converter 100m in Modification Example 13 differs from the power converter 100l in the connected position of each joining member 12a.

In a first heat dissipation member 4c, as with a second heat dissipation member 5c, joining members 12a are arranged on both sides of a part connected to a first semiconductor element 2. The first heat dissipation member 4c is connected to a circuit board 1 via these joining members 12a. Specifically, in addition to the joining member 12a provided between the first heat dissipation member 4c and an input wiring 6, another joining member 12a is provided between the circuit board 1 and the first heat dissipation member 4c, and between the first semiconductor element 2 and a second semiconductor element 3. The joining member 12a between the circuit board 1 and the first heat dissipation member 4c, and between the first and second semiconductor elements 2, 3 is connected to, for example, an insulating base material of the circuit board 1 and is, therefore, mechanically connected to the circuit board 1 but not electrically connected to the circuit board 1. The circuit board 1 has to be insulated from the joining members 12a by, for example, partially embedding a first output wiring 7 in the insulating base material.

The power converter 100m is able to exhibit the same advantageous effects as the power converter 100l. Additionally, in the power converter 100m, inclination of the first heat dissipation member 4c to the circuit board 1 can be inhibited. That is, in the power converter 100m, the first heat dissipation member 4c can easily be arranged in parallel to the first surface of the circuit board 1. Accordingly, in the power converter 100m, a surface of the first heat dissipation member 4c, which surface is exposed from a mold resin 13, is easily made flat. In the power converter 100m, the flat exposed surface of the first heat dissipation member 4c ensures the area of contact with a body to which the power converter 100m is attached, and, therefore, the improvement of heat dissipation can be expected. In FIG. 24, joining members 12a are employed. However, spacers made of metal, such as copper, as its main constituent can also be employed.

Modification Example 14

Figure 25:
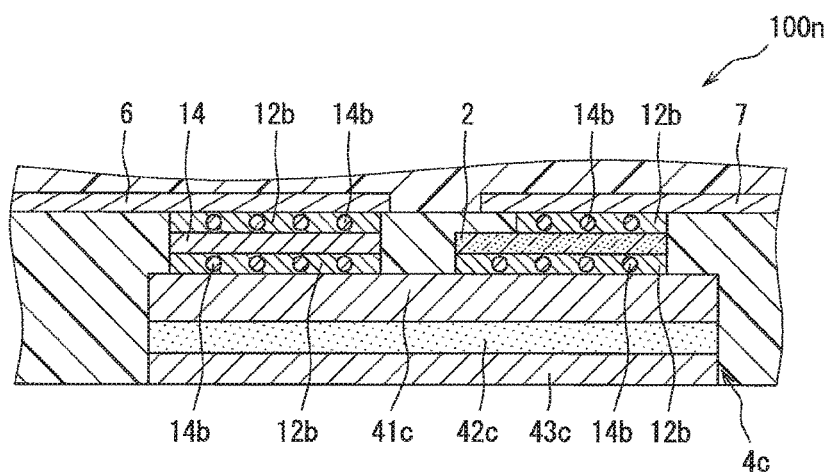
FIG. 25 is a sectional view illustrating a schematic configuration of a power converter according to Modification Example 14.

As shown in FIG. 25, a power converter 100n in Modification Example 14 differs from the power converter 100c in the structure of joining members 12b.

Unlike each joining member 12, each joining member 12b has balls 14b mixed therein. In the power converter 100n, joining members 12b are arranged on the top and bottom of a metal terminal 14, and on the top and bottom of a first semiconductor element 2. Therefore, an input wiring 6, the metal terminal 14, and so on are electrically and mechanically connected by means of the joining members 12b. In the power converter 100n, joining members 12b can also be used for a second heat dissipation member 5c in the same manner.

The power converter 100n is able to exhibit the same advantageous effects as the power converter 100c. Accordingly, in the power converter 100n, the heights of the first and second heat dissipation members 4c, 5c are easily made uniform when these members are fitted to the circuit board 1. Accordingly, the power converter 100*n* is able to exhibit the same advantageous effects as the power converter 100*l*.

Modification Example 15

Figure 26:
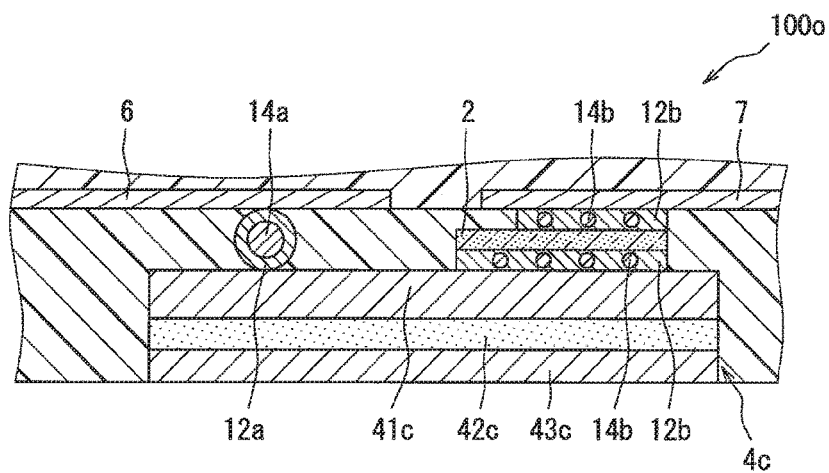
FIG. 26 is a sectional view illustrating a schematic configuration of a power converter according to Modification Example 15.

As shown in FIG. 26, a power converter 100*o* (the letter "o" is the small letter of "O" of the English alphabet) in Modification Example 15 differs from the power converter 100*n* in the structure of joining members 12*a*.

In the power converter 100*o*, a first heat dissipation member 4*c* and an input wiring 6 are connected to each other by means of a joining member 12*a*. Specifically, in the power converter 100*o*, a joining members 12*b* are used to connect a first semiconductor element 2 to a first output wiring 7 and to the first heat dissipation member 4*c*, whereas the joining member 12*a* is used to connect the first heat dissipation member 4*c* to the input wiring 6. In the power converter 100*o*, the joining member 12*a* and the joining members 12*b* can also be used for a second semiconductor element 3 in the same manner.

The power converter 100*o* is able to exhibit the same advantageous effects as the power converter 100*n*.

Modification Example 16

Figure 27:
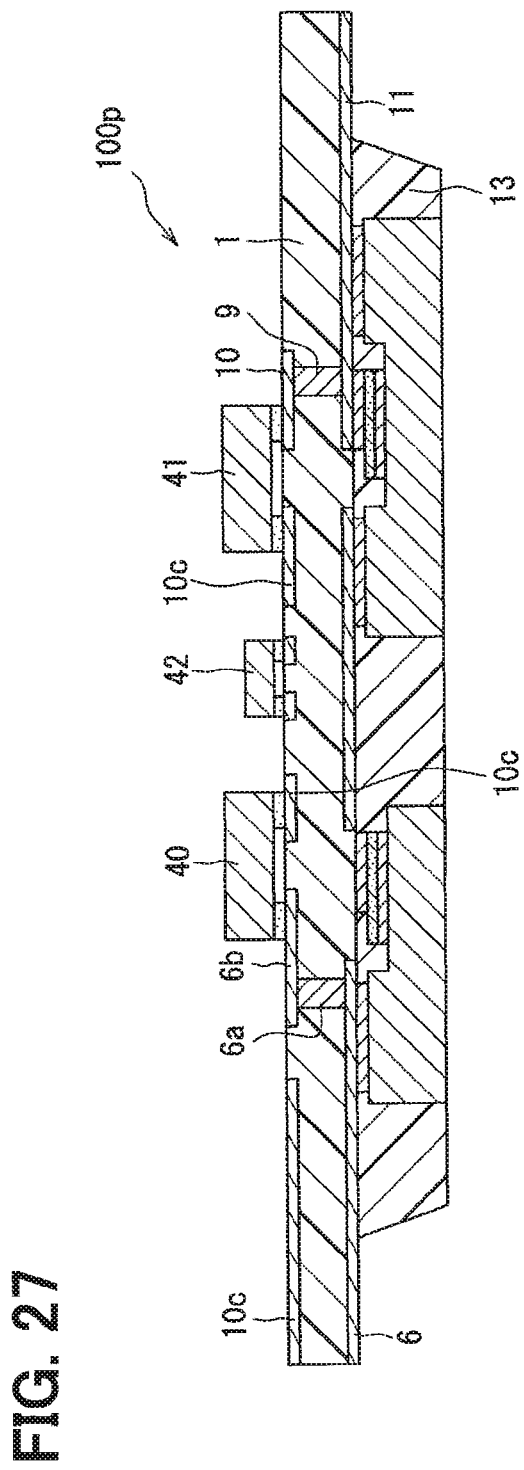
FIG. 27 is a sectional view illustrating a schematic configuration of a power converter according to Modification Example 16.
Figure 28:
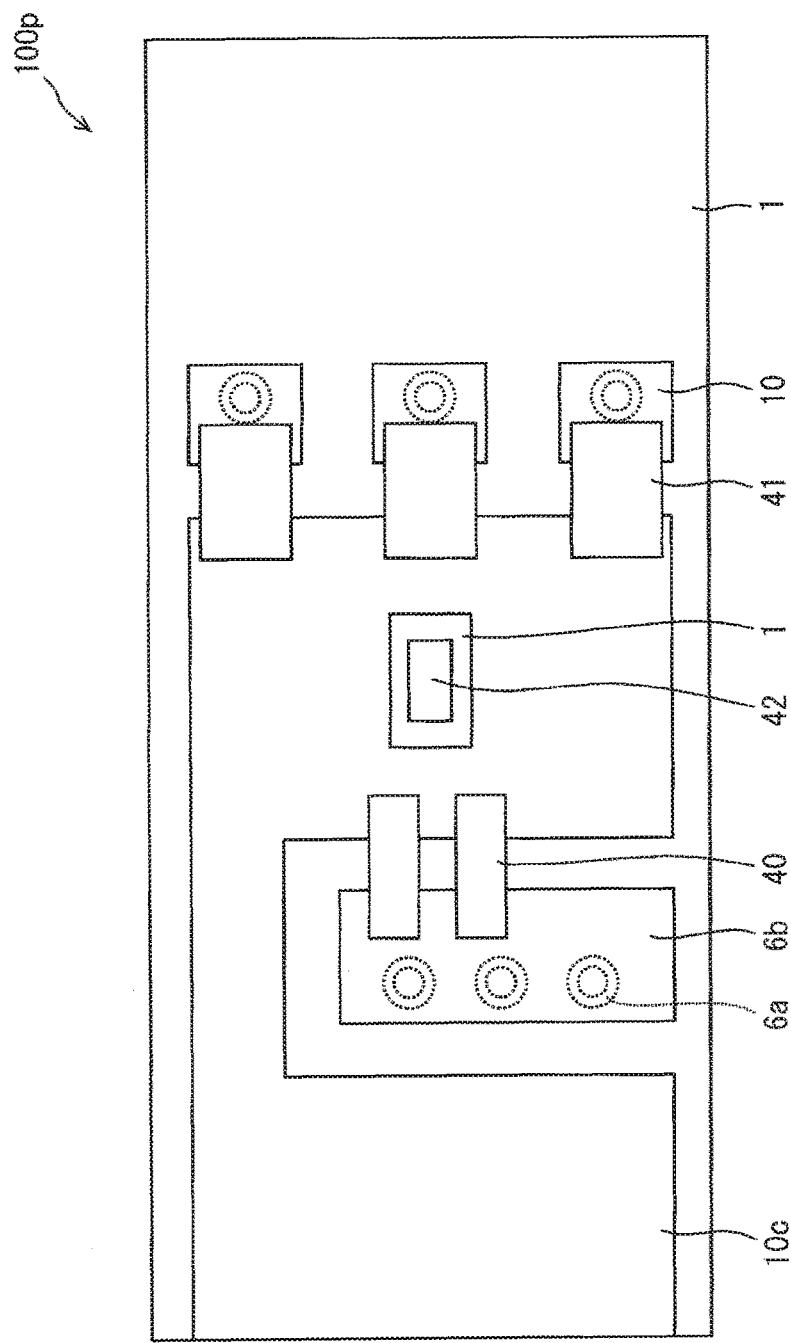
FIG. 28 is a plan view illustrating the schematic configuration of the power converter according to Modification Example 16.

The power converter 100*p* in Modification Example 16 differs from the power converters 100*i*, 100*j*, 100*k* in that a snubber capacitor 40, a shunt resistor 41, and a thermistor 42 are all mounted, as shown in FIGS. 27, 28.

In the power converter 100*p*, as described above, the snubber capacitor 40, the shunt resistor 41, and the thermistor 42 are mounted on a surface opposite to a circuit board 1. In the circuit board 1, a via 6*a* and a separation part 6*b* are formed. Additionally, in the circuit board 1, a division part 10*c* is formed. This division part 10*c* is a wiring connected to a second ground wiring 10 via the shunt resistor 41, and is the same as the division part 10*a*. Additionally, the division parts 10*c* are formed so as to avoid the thermistor 42 and the separation part 6*b*.

The power converter 100*p* is able to exhibit the advantageous effects as all the power converters 100*i*, 100*j*, 100*k*.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A power converter, comprising:
   a circuit board that includes an insulating substrate and a plurality of wirings arranged on the insulating substrate; and
   a first switching element and a second switching element that are arranged on a first surface of the circuit board and are connected in series, wherein:
   the first switching element has a first electrode and a second electrode;
   the second switching element has a third electrode and a fourth electrode;
   the plurality of wirings include a first wiring connected to the first electrode, a second wiring connected to the second electrode and the third electrode, a third wiring connected to the fourth electrode, a fourth wiring serving as an output wiring connected to the third electrode, and a fifth wiring connected to the third wiring;
   the first wiring, the second wiring, the third wiring, and the fourth wiring are arranged in a line in order and are arranged on the first surface; and
   the fifth wiring is arranged on a second surface opposite to the first surface and is arranged to be opposed to the first wiring, the second wiring, and the third wiring.

2. The power converter according to claim 1, further comprising:
   a resin part that seals the first switching element and the second switching element and also seals at least a part of each of the first wiring, the second wiring, the third wiring, and the fourth wiring.

3. The power converter according to claim 1, further comprising:
   three series circuits, each of which includes the first switching element and the second switching element; and
   three straight wiring units, each of which includes the first wiring, the second wiring, the third wiring, and the fourth wiring, correspondingly provided to each of the three series circuits,
   wherein the three straight wiring units are provided parallel to one another.

4. The power converter according to claim 1, wherein:
   the first switching element is a vertical element having the second electrode arranged on an opposing surface of the first switching element opposed to the circuit board, and the first electrode arranged on a rear surface of the first switching element opposed to the opposing surface;
   the second switching element is a vertical element having the fourth electrode arranged on an opposing surface of the second switching element opposed to the circuit board, and the third electrode arranged on a rear surface of the second switching element opposed to the opposing surface;
   the first switching element includes a first conductive connecting member electrically connecting the first electrode and the first wiring; and
   the second switching element includes a second conductive connecting member electrically connecting the third electrode, the second wiring, and the fourth wiring.

5. The power converter according to claim 4, wherein:
   the first connecting member is a first heat dissipation member that dissipates heat generated by the first switching element; and
   the second connecting member is a second heat dissipation member that dissipates heat generated by the second switching element.

6. The power converter according to claim 5,
   wherein the second heat dissipation member is divided into: a first member connecting the third electrode and the second wiring; and a second member connecting the third electrode and the fourth wiring.

7. The power converter according to claim 4, wherein:
   the first switching element has the second electrode arranged on an opposing surface of the first switching element opposed to the circuit board, and the first electrode arranged on a rear surface of the first switching element opposed to the opposing surface;
   the second switching element has the fourth electrode arranged on an opposing surface of the second switching element opposed to the circuit board, and the third electrode arranged on a rear surface of the second switching element opposed to the opposing surface;

the first connecting member is a first bonding wire connecting the first electrode and the first wiring; and the second connecting member includes a second bonding wire connecting the third electrode and the second wiring, and a third bonding wire connecting the third electrode and the fourth wiring.

8. The power converter according to claim 1, wherein:

the first switching element is a horizontal element having the first electrode and the second electrode arranged on an opposing surface of the first switching element opposed to the circuit board; and the second switching element is a horizontal element having the third electrode and the fourth electrode arranged on an opposing surface opposed to the circuit board.

9. The power converter according to claim 8, wherein:

the first switching element has a third heat dissipation member, which is arranged on an opposing surface of the first switching element opposed to the circuit board, to dissipate heat generated by the first switching element; and the second switching element has a fourth heat dissipation member, which is arranged on an opposing surface opposed to the circuit board, to dissipate heat generated by the second switching element.

10. The power converter according to claim 1, further comprising:

a detecting element mounted on the second surface of the circuit board to detect current or voltage, wherein the fifth wiring includes a plurality of wiring members electrically connected via the detecting element.

11. The power converter according to claim 1, further comprising:

a temperature sensor mounted on the second surface of the circuit board to detect a temperature of the circuit board, wherein the fifth wiring is arranged to be separated from the temperature sensor.

12. The power converter according to claim 1, further comprising:

a snubber circuit mounted on the second surface of the circuit board;

a first conductive interlayer connecting member embedded in the insulating substrate and connected to the first wiring; and a separation part arranged on the second surface and connected to the first wiring via the first interlayer connecting member, wherein:

the fifth wiring is arranged to be separated from the separation part, and the snubber circuit is electrically connected to the fifth wiring and the separation part.

13. The power converter according to claim 1, further comprising:

a second conductive interlayer connecting member embedded in the insulating substrate and connecting the third wiring and the fifth wiring.

* * * * *